(12) United States Patent
Park et al.

(10) Patent No.: US 12,707,835 B2
(45) Date of Patent: Aug. 11, 2026

(54) DISPLAY PANEL INCLUDING FIRST AND SECOND CONDUCTIVE BUS LINES AND ELECTRONIC APPARATUS INCLUDING THE SAME

(71) Applicant: Samsung Display Co., Ltd., Yongin-si (KR)

(72) Inventors: Hyungjun Park, Yongin-si (KR); Taehyoung No, Yongin-si (KR); Junyong An, Yongin-si (KR); Nuree Um, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 658 days.

(21) Appl. No.: 18/185,233

(22) Filed: Mar. 16, 2023

(65) Prior Publication Data

US 2023/0413622 A1 Dec. 21, 2023

(30) Foreign Application Priority Data

May 18, 2022 (KR) ........................ 10-2022-0061102

(51) Int. Cl.
*H10K 59/12* (2023.01)
*G09G 3/3233* (2016.01)
(Continued)

(52) U.S. Cl.
CPC ......... *H10K 59/131* (2023.02); *G09G 3/3233* (2013.01); *H10K 59/124* (2023.02);
(Continued)

(58) Field of Classification Search
CPC .... H10K 59/131; H10K 59/65; G09G 3/3233; G09G 2300/0819; G01G 2300/0842
(Continued)

(56) References Cited

U.S. PATENT DOCUMENTS

2021/0151534 A1* 5/2021 Ota ..................... H10K 50/828
2021/0265430 A1 8/2021 Chang et al.
(Continued)

FOREIGN PATENT DOCUMENTS

CN 110288945 A 9/2019
CN 110874990 A 3/2020
(Continued)

*Primary Examiner* — Phuc T Dang
(74) *Attorney, Agent, or Firm* — Womble Bond Dickinson (US) LLP

(57) ABSTRACT

A display panel includes: first light-emitting diodes at a first display area, second light-emitting diodes at a second display area located within the first display area, and third light-emitting diodes at a third display area between the first display area and the second display area; first sub-pixel circuits at the first display area, and electrically connected to the first light-emitting diodes, respectively; second and third sub-pixel circuits at the third display area, the second sub-pixel circuits being electrically connected to the second light-emitting diodes, and the third sub-pixel circuits being electrically connected to the third light-emitting diodes; a first conductive bus line extending in a first direction, and electrically connecting one of the second light-emitting diodes to one of the second sub-pixel circuits; and a second conductive bus line extending in a second direction, and electrically connecting another of the second light-emitting diodes to another of the second sub-pixel circuits.

17 Claims, 12 Drawing Sheets

(51) Int. Cl.
*H10K 59/124* (2023.01)
*H10K 59/131* (2023.01)
*H10K 59/65* (2023.01)

(52) U.S. Cl.
CPC ..... *H10K 59/65* (2023.02); *G09G 2300/0819* (2013.01); *G09G 2300/0842* (2013.01); *G09G 2310/0202* (2013.01); *G09G 2360/14* (2013.01)

(58) Field of Classification Search
USPC ............................................................ 257/40
See application file for complete search history.

(56) References Cited

U.S. PATENT DOCUMENTS

| | | | | |
|---|---|---|---|---|
| 2021/0343222 | A1* | 11/2021 | Hei | G09G 3/3233 |
| 2022/0123094 | A1* | 4/2022 | Qiu | H10K 59/353 |
| 2022/0208060 | A1* | 6/2022 | Kim | G09G 3/3233 |
| 2022/0310005 | A1 | 9/2022 | Chen | |

FOREIGN PATENT DOCUMENTS

| | | | | | |
|---|---|---|---|---|---|
| CN | 111708199 | A | | 9/2020 | |
| CN | 111725287 | A | | 9/2020 | |
| CN | 112102783 | A | | 12/2020 | |
| CN | 112148155 | A | * | 12/2020 | H10K 59/40 |
| CN | 113178473 | A | | 7/2021 | |
| CN | 213692056 | U | | 7/2021 | |
| KR | 10-2021-0084639 | A | | 7/2021 | |
| WO | WO-2022068152 | A1 | * | 4/2022 | G09G 3/3233 |

* cited by examiner

FIG. 2

DISPLAY PANEL INCLUDING FIRST AND SECOND CONDUCTIVE BUS LINES AND ELECTRONIC APPARATUS INCLUDING THE SAME

CROSS-REFERENCE TO RELATED APPLICATION

This application claims priority to and the benefit of Korean Patent Application No. 10-2022-0061102, filed on May 18, 2022, in the Korean Intellectual Property Office, the entire disclosure of which is incorporated by reference herein.

BACKGROUND

1. Field

Aspects of one or more embodiments of the present disclosure relate to a display panel, and a structure for an electronic apparatus including the display panel.

2. Description of the Related Art

A display panel is an apparatus configured to visually display data. Recently, the usage of display panels has diversified. As display panels have become thinner and lighter, their range of use has gradually been extended.

As an alternative for adding various functions, while increasing an area occupied by a display area, research has been carried out on a display panel for adding various functions inside the display area, in addition to a function for displaying images.

The above information disclosed in this Background section is for enhancement of understanding of the background of the present disclosure, and therefore, it may contain information that does not constitute prior art.

SUMMARY

One or more embodiments of the present disclosure are directed to a display panel including a transmissive area inside a display area, and a structure for an electronic apparatus including the display panel.

Additional aspects and features will be set forth, in part, in the description that follows, and in part, will be apparent from the description, or may be learned by practicing one or more of the presented embodiments of the present disclosure.

According to one or more embodiments of the present disclosure, a display panel includes: a first display area, a second display area located within the first display area, and a third display area between the first display area and the second display area; a plurality of light-emitting diodes including: first light-emitting diodes located at the first display area; second light-emitting diodes located at the second display area; and third light-emitting diodes located at the third display area; a plurality of first sub-pixel circuits located at the first display area, and electrically connected to the first light-emitting diodes, respectively; a plurality of second sub-pixel circuits and a plurality of third sub-pixel circuits located at the third display area, the plurality of second sub-pixel circuits being electrically connected to the second light-emitting diodes, and the plurality of third sub-pixel circuits being electrically connected to the third light-emitting diodes; a first conductive bus line extending in a first direction, and electrically connecting one of the second light-emitting diodes to one of the plurality of second sub-pixel circuits; and a second conductive bus line extending in a second direction crossing the first direction, and electrically connecting another one of the second light-emitting diodes to another one of the plurality of second sub-pixel circuits.

In an embodiment, the second display area may include a transmissive area between the second light-emitting diodes.

In an embodiment, the first conductive bus line and the second conductive bus line may each extend from the third display area toward the second display area, and may include a light-transmissive conductive material.

In an embodiment, the display panel may further include an insulating layer between the first conductive bus line and the second conductive bus line, and a portion of the first conductive bus line and a portion of the second conductive bus line may cross each other with the insulating layer therebetween.

In an embodiment, the one of the second light-emitting diodes and the another one of the second light-emitting diodes may be located in a same column as each other in the second direction.

In an embodiment, the one of the plurality of second sub-pixel circuits may be spaced from the second display area in the first direction, the another one of the plurality of second sub-pixel circuits may be spaced from the second display area in the second direction, and the one of the plurality of second sub-pixel circuits and the another one of the plurality of second sub-pixel circuits may be electrically connected to a same data line as each other.

In an embodiment, the same data line may be curved to partially surround the second display area.

In an embodiment, the one of the plurality of second sub-pixel circuits may be electrically connected to a scan line that is electrically connected to the first sub-pixel circuits in a k-th row, where k is a natural number, and the another one of the plurality of second sub-pixel circuits may be electrically connected to a scan line that is electrically connected to the first sub-pixel circuits in a (k+2n)-th row, where n is a natural number.

In an embodiment, the one of the plurality of second sub-pixel circuits may be electrically connected to two of the second light-emitting diodes that are configured to emit light of a same color as each other.

In an embodiment, the two of the second light-emitting diodes that are configured to emit the light of the same color as each other may be electrically connected to each other by a connection line including a light-transmissive conductive material.

According to one or more embodiments of the present disclosure, an electronic apparatus includes: a display panel including a first display area, a second display area located within the first display area, and a third display area between the first display area and the second display area; and a component overlapping with a transmissive area of the second display area. The display panel includes: first light-emitting diodes located at the first display area; a plurality of first sub-pixel circuits located at the first display area, and electrically connected to the first light-emitting diodes, respectively; second light-emitting diodes located at the second display area; third light-emitting diodes located at the third display area; a plurality of second sub-pixel circuits and a plurality of third sub-pixel circuits located at the third display area, the plurality of second sub-pixel circuits being electrically connected to the second light-emitting diodes, and the plurality of third sub-pixel circuits being electrically connected to the third light-emitting diodes; a first conductive bus line extending in a first direction, and electrically connecting one of the second light-emitting diodes to one of the plurality of second sub-pixel circuits; and a second conductive bus line extending in a second direction crossing the first direction, and electrically connecting another one of the second light-emitting diodes to another one of the plurality of second sub-pixel circuits.

In an embodiment, the component may include a sensor or a camera.

In an embodiment, the first conductive bus line and the second conductive bus line may each include a light-transmissive conductive material.

In an embodiment, the display panel may further include an insulating layer between the first conductive bus line and the second conductive bus line, and a portion of the first conductive bus line may cross a portion of the second conductive bus line, with the insulating layer therebetween.

In an embodiment, the one of the second light-emitting diodes and the another one of the second light-emitting diodes may be located in a same column as each other in the second direction.

In an embodiment, the one of the plurality of second sub-pixel circuits may be spaced from the second display area in the first direction, the another one of the plurality of second sub-pixel circuits may be spaced from the second display area in the second direction, and the one of the plurality of second sub-pixel circuits and the another one of the plurality of second sub-pixel circuits may be electrically connected to a same data line as each other.

In an embodiment, the same data line may be curved to partially surround the second display area.

In an embodiment, the one of the plurality of second sub-pixel circuits may be electrically connected to a scan line that is electrically connected to the first sub-pixel circuits in a k-th row, where k is a natural number, and the another one of the plurality of second sub-pixel circuits may be electrically connected to a scan line that is electrically connected to the first sub-pixel circuits in a (k+2n)-th row, where n is a natural number.

In an embodiment, the one of the plurality of second sub-pixel circuits may be electrically connected to two of the second light-emitting diodes configured to emit light of a same color as each other.

In an embodiment, the two of the second light-emitting diodes configured to emit the light of the same color as each other may be electrically connected to each other by a connection line including a light-transmissive conductive material.

BRIEF DESCRIPTION OF THE DRAWINGS

The above and other aspects and features of the present disclosure will be more clearly understood from the following detailed description of the illustrative, non-limiting embodiments with reference to the accompanying drawings, in which:

FIG. 2 is a schematic cross-sectional view of an electronic apparatus according to an embodiment;

DETAILED DESCRIPTION

Figure 1:
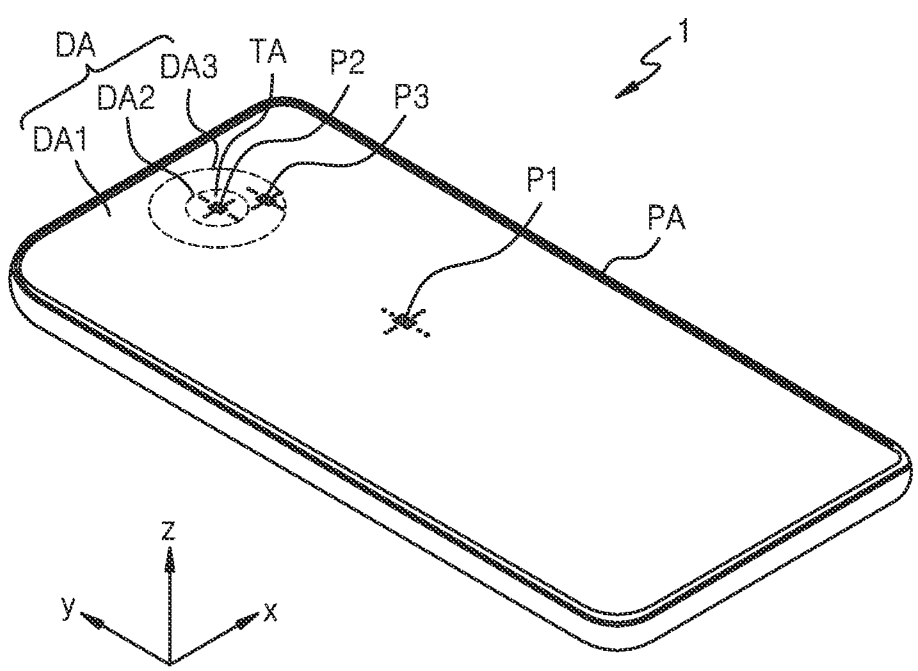
FIG. 1 is a schematic perspective view of an electronic apparatus according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic perspective view of an electronic apparatus 1 according to an embodiment.

Referring to FIG. 1, the electronic apparatus 1 may include a display area DA, and a peripheral area PA outside the display area DA. The display area DA may be configured to display images using sub-pixels. The peripheral area PA is arranged outside the display area DA, and is a non-display area in which images are not displayed. The peripheral area PA may surround (e.g., around a periphery of) the display area DA entirely. A driver and the like configured to provide electric signals or power to the display area DA may be arranged at (e.g., in or on) the peripheral area PA. A pad may be arranged at (e.g., in or on) the peripheral area PA. The pad is a region to which electronic elements or a printed circuit board may be electrically connected.

Hereinafter, for convenience, while the electronic apparatus 1 is described in more detail in the context of a smartphone, the present disclosure is not limited thereto. The electronic apparatus 1 is applicable to various suitable products, such as televisions, notebook computers, monitors, advertisement boards, and Internet of things (IoT) devices, as well as portable electronic apparatuses, such as mobile phones, smartphones, tablet personal computers (PC), mobile communication terminals, electronic organizers, electronic books, portable multimedia players (PMP), navigations, and ultra mobile personal computers (UMPC). In addition, the electronic apparatus 1 is applicable to wearable devices, such as smartwatches, watchphones, glasses-type displays, and head-mounted displays (HMD). In addition, in an embodiment, the electronic apparatus 1 is applicable to instrument panels for automobiles, center fascias for automobiles, center information displays (CID) arranged in a dashboard, room mirror displays that replace side mirrors of automobiles, and displays arranged on the backside of front seats as an entertainment for back seats of automobiles.

The display area DA may include a first display area DA1, a second display area DA2, and a third display area DA3. The display area DA may be configured to display images by using sub-pixels arranged two-dimensionally. The sub-pixels may include first sub-pixels P1 arranged at (e.g., in or on) the first display area DA1, second sub-pixels P2 arranged at (e.g., in or on) the second display area DA2, and third sub-pixels P3 arranged at (e.g., in or on) the third display area DA3.

The first display area DA1 may occupy most of the area of the display area DA. When the first display area DA1 occupies most of the area of the display area DA, the area of the first display area DA1 is 50% or more of the area of the display area DA. The second display area DA2 may be arranged inside (e.g., within) the display area DA. As an example, the second display area DA2 may be surrounded (e.g., around a periphery thereof) entirely by the first display area DA1. The third display area DA3 may be arranged between the first display area DA1 and the second display area DA2. The third display area DA3 may surround (e.g., around a periphery of) the second display area DA2 entirely, and be surrounded (e.g., around a periphery thereof) entirely by the first display area DA1.

The second display area DA2 and the third display area DA3 may each have a smaller area than the area of the first display area DA1. In an embodiment, FIG. 1 shows that the second display area DA2 and the third display area DA3 each have a circular shape, but the present disclosure is not limited thereto, and the second display area DA2 and the third display area DA3 may each have a quadrangular or approximately quadrangular shape in another embodiment.

While FIG. 1 shows that the second display area DA2 and the third display area DA3 are arranged at the center in an upper side (e.g., in a +y direction) of the display area DA having the quadrangular or approximately quadrangular shape when viewed in a direction perpendicular to or approximately perpendicular to an upper surface of the electronic apparatus 1 (e.g., in a plan view), the present disclosure is not limited thereto. The second display area DA2 and the third display area DA3 may be arranged, for example, at (e.g., in or on) the upper right side or the upper left side of the display area DA.

The second display area DA2 may be configured to display images by using the second sub-pixels P2, and may transmit light and/or sound through regions between the second sub-pixels P2. Hereinafter, a region that may transmit light and/or sound is referred to as a transmissive area TA. In other words, the second display area DA2 may include the transmissive area TA between the second sub-pixels P2.

Figure 2:
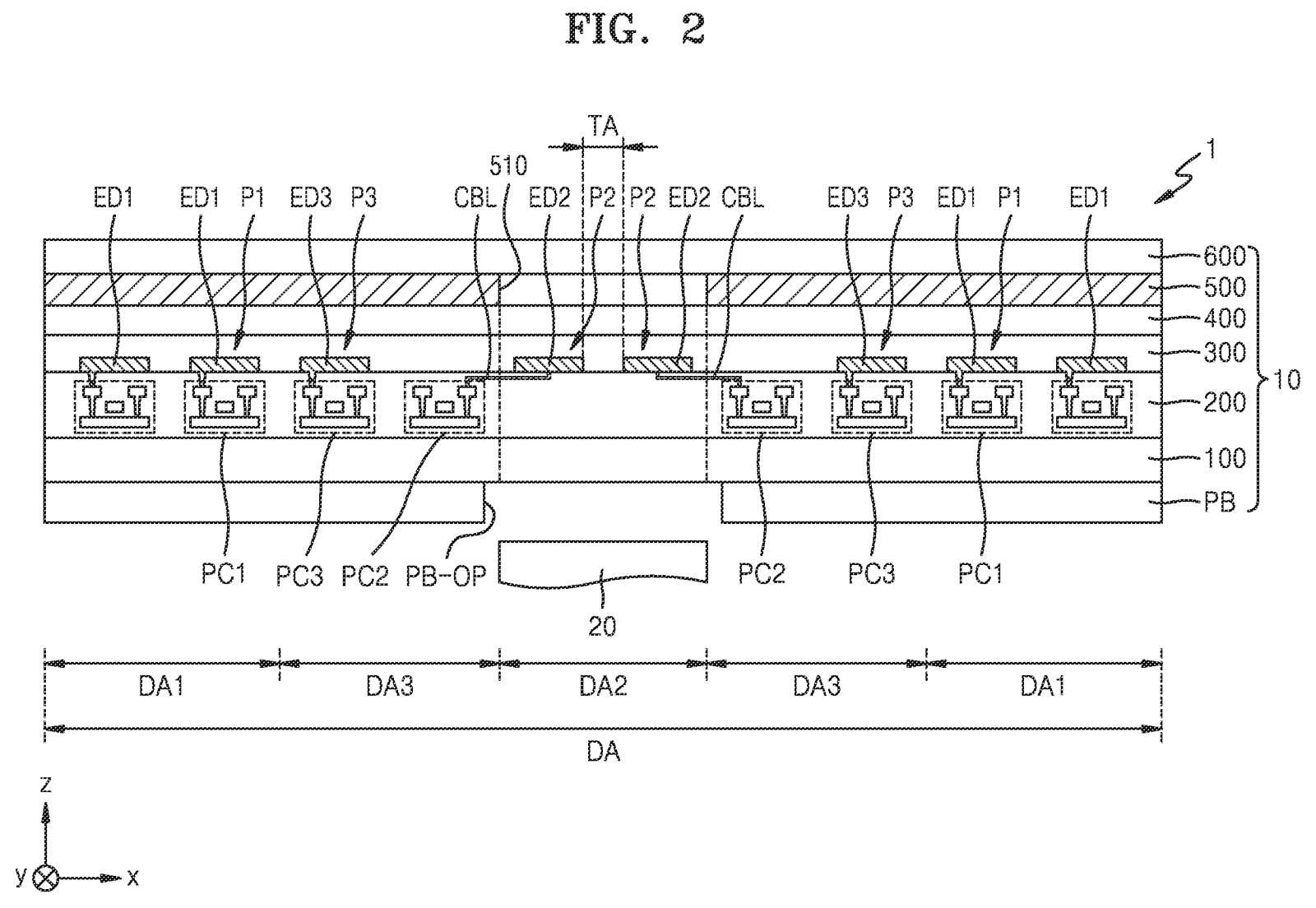

FIG. 2 is a schematic cross-sectional view of the electronic apparatus 1 according to an embodiment.

Referring to FIG. 2, the electronic apparatus 1 may include a display panel 10, and a component 20 overlapping with the display panel 10. The component 20 may be arranged in the second display area DA2.

The component 20 may be an electronic element that uses light or sound. As an example, the electronic element may be a sensor that measures a distance, such as a proximity sensor, a sensor that recognizes a portion of a user's body (e.g., a fingerprint, an iris, a face, and/or the like), a small lamp that outputs light, or an image sensor (e.g., a camera) that photographs images. The electronic element that uses light may use light in various suitable wavelength bands, such as visible light, infrared light, ultraviolet light, and/or the like. The electronic element that uses sound may use ultrasonic waves or sound in different frequency bands.

The second display area DA2 may include the transmissive area TA through which light and/or sound may pass that is output from the component 20 to the outside or that progresses toward the component 20 from the outside. In an embodiment, the transmissive area TA is a region through which light may pass, and may correspond to regions between the second sub-pixels P2. In the electronic apparatus 1 according to an embodiment, in the case where light is transmitted through the second display area DA2 including the transmissive area TA, a light transmittance thereof may be about 10% or more, for example, such as about 25% or more, about 40% or more, about 50% or more, about 85% or more, or about 90% or more.

The first sub-pixel P1, the second sub-pixel P2, and the third sub-pixel P3 may each be configured to emit light by using a light-emitting diode, and each of the light-emitting diodes may be arranged at (e.g., in or on) the display area DA of the display panel 10. Hereinafter, a light-emitting diode corresponding to the first sub-pixel P1 at (e.g., in or on) the first display area DA1 may be referred to as a first light-emitting diode ED1, a light-emitting diode corresponding to the second sub-pixel P2 at (e.g., in or on) the second display area DA2 may be referred to as a second light-emitting diode ED2, and a light-emitting diode corresponding to the third sub-pixel P3 at (e.g., in or on) the third display area DA3 may be referred to as a third light-emitting diode ED3. The first to third light-emitting diodes ED1, ED2, and ED3 may be arranged on (e.g., over) the substrate 100.

The substrate 100 may include an insulating material, such as glass or a polymer resin. A protective film PB may be disposed on a backside (e.g., a rear or a lower surface) of the substrate 100. The substrate 100 may be a rigid substrate, or a flexible substrate that is bendable, foldable, and/or rollable. The protective film PB may include an opening PB-OP located at (e.g., in or on) the second display area DA2, so as to improve a transmittance of the transmissive area TA.

The first light-emitting diode ED1 is arranged at (e.g., in or on) the first display area DA1, and electrically connected to a first sub-pixel circuit PC1 arranged at (e.g., in or on) the first display area DA1. The first sub-pixel circuit PC1 may include transistors, and a storage capacitor electrically connected to the transistors.

The second light-emitting diode ED2 is arranged at (e.g., in or on) the second display area DA2. The second light-emitting diode ED2 is electrically connected to a second sub-pixel circuit PC2. The second sub-pixel circuit PC2 is not arranged at (e.g., in or on) the second display area DA2, such that a transmittance and a transmissive area of the transmissive area TA at (e.g., in or on) the second display area DA2 may be improved. The second sub-pixel circuit PC2 may be arranged at (e.g., in or on) the third display area DA3. The second light-emitting diode ED2 may be electrically connected to the second sub-pixel circuit PC2 through a conductive bus line CBL.

The conductive bus line CBL may electrically connect the second sub-pixel circuit PC2 at (e.g., in or on) the third display area DA3 to the second light-emitting diode ED2 at (e.g., in or on) the second display area DA2. The conductive bus line CBL may include a light transmissive conductive material, for example, such as a transparent conductive oxide (TCO).

The third light-emitting diode ED3 is arranged at (e.g., in or on) the third display area DA3, and electrically connected to a third sub-pixel circuit PC3 arranged at (e.g., in or on) the third display area DA3. The third sub-pixel circuit PC3 may include transistors, and a storage capacitor electrically connected to the transistors.

The first to third light-emitting diodes ED1, ED2, and ED3 may be light-emitting elements that emit light of a desired color (e.g., a predetermined or preset color), and may include organic light-emitting diodes. In another embodiment, the first to third light-emitting diodes ED1, ED2, and ED3 may include inorganic light-emitting diodes, or light-emitting diodes including quantum dots.

The first to third light-emitting diodes ED1, ED2, and ED3 may be covered with an encapsulation layer 300. The encapsulation layer 300 may be a thin-film encapsulation layer, including an inorganic encapsulation layer and an organic encapsulation layer. The inorganic encapsulation layer includes an inorganic insulating material, and the organic encapsulation layer includes an organic insulating material. In an embodiment, the encapsulation layer 300 may include a first inorganic encapsulation layer, a second inorganic encapsulation layer, and an organic encapsulation layer between the first and second inorganic encapsulation layers.

In another embodiment, the encapsulation layer 300 may be an encapsulation substrate, such as glass. A sealant, such as a frit and/or the like, may be disposed between the substrate 100 and the encapsulation substrate. The sealant may be located at (e.g., in or on) the peripheral area PA, and may extend to surround (e.g., around peripheries of) the outer edges of the display area DA to prevent or substantially prevent moisture from penetrating toward the first to third light-emitting diodes ED1, ED2, and ED3 through a lateral surface.

An input sensing layer 400 may be disposed on the encapsulation layer 300. The input sensing layer 400 may obtain coordinate information corresponding to an external input, for example, such as a touch event of a finger or an object such as a stylus pen. The input sensing layer 400 may include a touch electrode, and trace lines connected to the touch electrode. The input sensing layer 400 may sense an external input by using a mutual capacitance method, or a self-capacitance method.

An optical functional layer 500 may include an anti-reflection layer. The anti-reflection layer may reduce reflectivity of light (e.g., external light) incident toward the display panel 10 from the outside through a cover window 600. The anti-reflection layer may include a retarder and a polarizer. In the case where the optical functional layer 500 includes a polarizer, the optical functional layer 500 may include an opening 510 located at (e.g., in or on) the second display area DA2, and thus, a transmittance of the transmissive area TA may be improved In another embodiment, the anti-reflection layer may include a black matrix and color filters. The color filters may be arranged according to colors of light emitted by the first to third light-emitting diodes ED1, ED2, and ED3, respectively. In the case where the optical functional layer 500 includes the black matrix and the color filters, a light transmissive material may be arranged in a position corresponding to the transmissive area TA.

In another embodiment, the anti-reflection layer may include a destructive interference structure. The destructive interference structure may include a first reflection layer and a second reflection layer disposed at (e.g., in or on) different layers from each other. First-reflected light and second-reflected light reflected by the first reflection layer and the second reflection layer, respectively, may destructively interfere with each other, and thus, the reflectivity of external light may be reduced.

The cover window 600 may be disposed on the optical functional layer 500. The cover window 600 may be coupled to (e.g., connected to or attached to) the optical functional layer 500 by an adhesive layer, such as a transparent optical clear adhesive, which is disposed between the cover window 600 and the optical functional layer 500. The cover window 600 may include glass or plastic. The plastic may include polyethersulfone, polyacrylate, polyetherimide, polyethylene naphthalate, polyethylene terephthalate, polyphenylene sulfide, polyarylate, polyimide, polycarbonate, or cellulose acetate propionate.

The cover window 600 may include a flexible cover window. As an example, the cover window 600 may include a polyimide cover window, or an ultra-thin glass cover window.

Figure 3:
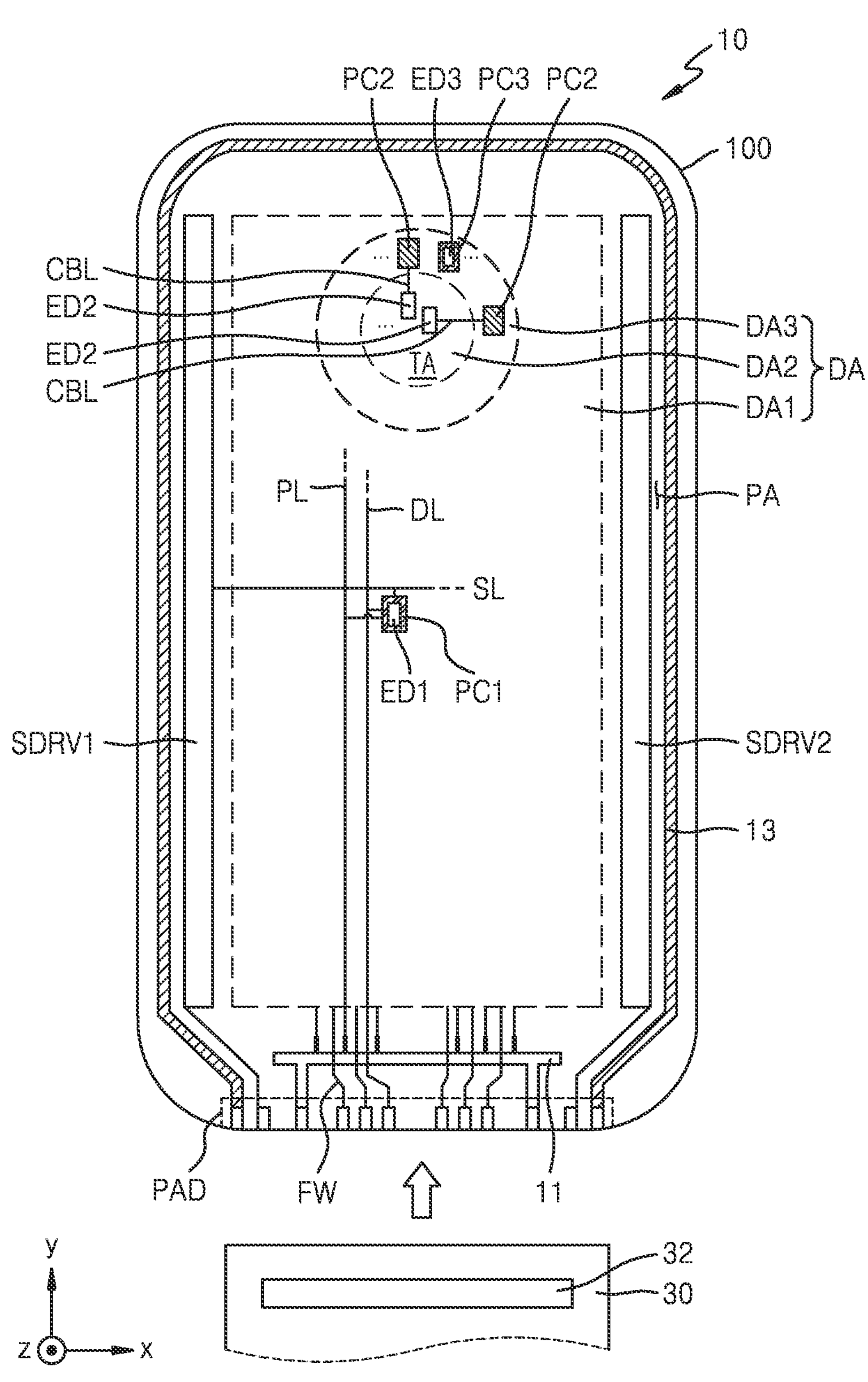
FIG. 3 is a schematic plan view of a display panel according to an embodiment.

FIG. 3 is a schematic plan view of the display panel 10 according to an embodiment.

Referring to FIG. 3, the display panel 10 may include the display area DA and the peripheral area PA. The display area DA may include the first to third display areas DA1, DA2, and DA3.

Light-emitting diodes are arranged at (e.g., in or on) the first to third display areas DA1, DA2, and DA3. Sub-pixel circuits electrically connected to the light-emitting diodes, respectively, are arranged at (e.g., in or on) the first and third display areas DA1 and DA3, but not at (e.g., in or on) the second display area DA2. As an example, the first sub-pixel circuits PC1 that are electrically connected to the first light-emitting diodes ED1 arranged at (e.g., in or on) the first display area DA1 may be arranged at (e.g., in or on) the first display area DA1. The second and third sub-pixel circuits PC2 and PC3 that are electrically connected to the second and third light-emitting diodes ED2 and ED3 arranged at (e.g., in or on) the second and third display areas DA2 and DA3, respectively, may be arranged at (e.g., in or on) the third display area DA3. In other words, some of the sub-pixel circuits (e.g., the second sub-pixel circuits PC2) arranged at (e.g., in or on) the third display area DA3 may be electrically connected to the second light-emitting diodes ED2 arranged at (e.g., in or on) the second display area DA2, and others of the sub-pixel circuits (e.g., the third sub-pixel circuits PC3) arranged at (e.g., in or on) the third display area DA3 may be electrically connected to the third light-emitting diodes ED3 arranged at (e.g., in or on) the third display area DA3.

The first light-emitting diode ED1 is arranged at (e.g., in or on) the first display area DA1. Light emitted by the first light-emitting diode ED1 may correspond to light from the first sub-pixel P1 described above with reference to FIG. 1, and the position of the first light-emitting diode ED1 may be the position of the first sub-pixel P1. The first light-emitting diode ED1 may emit, for example, red, green, or blue light. The first sub-pixel circuit PC1 that drives the first light-emitting diode ED1 is arranged at (e.g., in or on) the first display area DA1, and may be electrically connected to the first light-emitting diode ED1.

The first sub-pixel circuit PC1 is electrically connected to a scan line SL and a data line DL. The scan line SL extends in a first direction (e.g., an x direction), and the data line DL extends in a second direction (e.g., a y direction). A first driving circuit SDRV1 and a second driving circuit SDRV2 configured to supply signals to each first sub-pixel circuit PC1, may be arranged at (e.g., in or on) the peripheral area PA.

The first driving circuit SDRV1 may be configured to apply scan signals to the first sub-pixel circuit PC1 through the scan line SL. The second driving circuit SDRV2 may be positioned opposite to the first driving circuit SDRV1 with the first display area DA1 therebetween. Some of the first sub-pixel circuits PC1 at (e.g., in or on) the first display area DA1 may be electrically connected to the first driving circuit SDRV1, and others (e.g., the rest) of the first sub-pixel circuits PC1 may be electrically connected to the second driving circuit SDRV2.

A pad PAD may be arranged at one side of the substrate 100. The pad PAD may be exposed by not being covered by an insulating layer, and may be connected to a circuit board 30. A control driver 32 may be disposed on the circuit board 30.

The control driver 32 may be configured to generate control signals to be transferred to the first driving circuit SDRV1 and the second driving circuit SDRV2. The control driver 32 may include a data driving circuit. The data driving circuit may be configured to generate data signals. The generated data signals may be transferred to the first sub-pixel circuits PC1 through a fan-out wiring FW and the data line DL. The fan-out wiring FW is arranged at (e.g., in or on) the peripheral area PA of the display panel 10, and the data line DL is connected to the fan-out wiring FW. In another embodiment, the data driving circuit may be arranged at (e.g., in or on) the peripheral area PA of the substrate 100.

The second light-emitting diode ED2 is arranged at (e.g., in or on) the second display area DA2. Light emitted by the second light-emitting diode ED2 may correspond to light from the second sub-pixel P2 described above with reference to FIG. 1, and the position of the second light-emitting diode ED2 may be the position of the second sub-pixel P2. The second light-emitting diode ED2 may emit, for example, red, green, or blue light.

The transmissive area TA may be located between the second light-emitting diodes ED2. In an embodiment, a region of the second display area DA2 where the second light-emitting diodes ED2 are not arranged may correspond to the transmissive area TA. To increase the area of the transmissive area TA, and to improve a transmittance of the transmissive area TA, the second sub-pixel circuit PC2 configured to drive the second light-emitting diode ED2 may be arranged at (e.g., in or on) the third display area DA3 outside the second display area DA2. The second sub-pixel circuit PC2 at (e.g., in or on) the third display area DA3 may be electrically connected to the second light-emitting diode ED2 at (e.g., in or on) the second display area DA2 through the conductive bus line CBL. At least one of the second light-emitting diodes ED2 may be electrically connected to a corresponding second sub-pixel circuit PC2 through a corresponding conductive bus line CBL extending in the first direction (e.g., the x direction), and at least one other of the second light-emitting diodes ED2 may be electrically connected to a corresponding second sub-pixel circuit PC2 through a corresponding conductive bus line CBL extending in the second direction (e.g., the y direction).

The third light-emitting diode ED3 is arranged at (e.g., in or on) the third display area DA3. Light emitted by the third light-emitting diode ED3 may correspond to light from the third sub-pixel P3 described above with reference to FIG. 1, and the position of the third light-emitting diode ED3 may be the position of the third sub-pixel P3. The third light-emitting diode ED3 may emit, for example, red, green, or blue light.

The third sub-pixel PC3 configured to drive the third light-emitting diode ED3 is arranged at (e.g., in or on) the third display area DA3. The third sub-pixel circuit PC3 is electrically connected to the third light-emitting diode ED3, and may be configured to operate the third light-emitting diode ED3.

The second sub-pixel circuit PC2 and the third sub-pixel circuit PC3 may be electrically connected to the first driving circuit SDRV1 and/or the second driving circuit SDRV2. At least one of the second sub-pixel circuits PC2 and/or at least one of the third sub-pixel circuits PC3 may share the same scan line with that of at least one of the first sub-pixel circuits PC1. At least one of the second sub-pixel circuits PC2 and/or at least one of the third sub-pixel circuits PC3 may share the same data line with that of at least one of the first sub-pixel circuits PC1.

A driving voltage supply line 11 and a common voltage supply line 13 may be arranged at (e.g., in or on) the peripheral area PA. The driving voltage supply line 11 may be configured to supply a driving voltage to a sub-pixel circuit, for example, such as to each of the first to third sub-pixel circuits PC1, PC2, and PC3. The common voltage supply line 13 may be configured to apply a common voltage to a second electrode (e.g., a cathode) of a light-emitting diode, for example, such as to those of the first to third light-emitting diodes ED1, ED2, and ED3.

The driving voltage supply line 11 may be arranged between the pad PAD and one side of the display area DA. The common voltage supply line 13 may have a loop shape having one open side, and that partially surrounds (e.g., around a periphery of) the display area DA in a plan view. The driving voltage supply line 11 may be electrically connected to the driving voltage line PL passing across the display area DA.

The first to third light-emitting diodes ED1, ED2, and ED3, the first to third sub-pixel circuits PC1, PC2, and PC3, the pad PAD, the first and second driving circuits SDRV1 and SDRV2, the driving voltage supply line 11, the common voltage supply line 13, and the like are arranged on the substrate 100. The shape of the display panel 10 shown in FIG. 3 may be the same or substantially the same as the shape of the substrate 100. Accordingly, when the display panel 10 includes the display area DA and the peripheral area PA, it should be understood that the substrate 100 includes the display area DA and the peripheral area PA.

Figure 4:
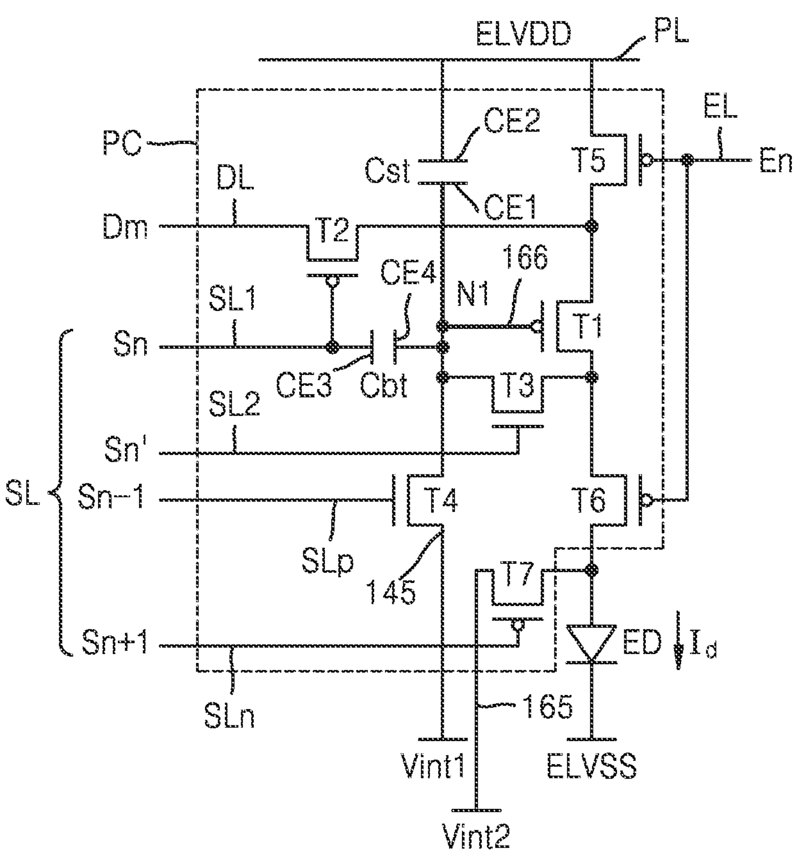
FIG. 4 is a schematic equivalent circuit diagram of a sub-pixel circuit electrically connected to a light-emitting diode of a display panel according to an embodiment.

FIG. 4 is a schematic equivalent circuit diagram of a sub-pixel circuit electrically connected to a light-emitting diode of the display panel 10 according to an embodiment. The light-emitting diode ED shown in FIG. 4 may correspond to any one of the first to third light-emitting diodes ED1, ED2, and ED3 described above with reference to FIG. 3. The sub-pixel circuit PC shown in FIG. 4 may correspond to any one of the first to third sub-pixel circuits PC1, PC2, and PC3 described above with reference to FIG. 3. In other words, an equivalent circuit diagram of the first sub-pixel circuit PC1 and the first light-emitting diode ED1, an equivalent circuit diagram of the second sub-pixel circuit PC2 and the second light-emitting diode ED2, and an equivalent circuit diagram of the third sub-pixel circuit PC3 and the third light-emitting diode ED3 (e.g., see FIG. 3) may each be the same or substantially the same as those shown in FIG. 4. As described above, the light-emitting diode ED may include an organic light-emitting diode, an inorganic light-emitting diode, or a quantum-dot light-emitting diode.

The light-emitting diode ED may be electrically connected to the sub-pixel circuit PC. Referring to FIG. 4, the sub-pixel circuit PC may include first to seventh transistors T1, T2, T3, T4, T5, T6, and T7, a storage capacitor Cst, and a boost capacitor Cbt. However, the present disclosure is not limited thereto, and in an embodiment, the sub-pixel circuit PC may not include the boost capacitor Cbt. Hereinafter, for convenience, the case where the sub-pixel circuit PC includes the boost capacitor Cbt is described in more detail.

Some of the transistors T1, T2, T3, T4, T5, T6, and T7 may be n-channel metal oxide semiconductor field-effect transistors (e.g., n-channel MOSFET or NMOS transistors), and others (e.g., the rest) may be p-channel metal oxide semiconductor field-effect transistors (e.g., p-channel MOSFET or PMOS transistors). As an example, as shown in FIG. 4, the third and fourth transistors T3 and T4 may be NMOS transistors, and the first, second, fifth, sixth, and seventh transistors T1, T2, T5, T6, and T7 may be PMOS transistors. In another embodiment, the third, fourth, and seventh transistors T3, T4, and T7 may be NMOS transistors, and the others (e.g., the rest) may be PMOS transistors. As another example, only one transistor from among the first to seventh transistors T1, T2, T3, T4, T5, T6, and T7 may be an NMOS transistor, and the others (e.g., the rest) may be PMOS transistors.

The first to seventh transistors T1, T2, T3, T4, T5, T6, and T7, the storage capacitor Cst, and the boost capacitor Cbt may be connected to signal lines. The signal lines may include the scan line SL, an emission control line EL, and the data line DL. The scan line SL may include a first scan line SL1 configured to transfer a first scan signal Sn, a second scan line SL2 configured to transfer a second scan signal Sn', a previous scan line SLp configured to transfer a previous scan signal S−1, and a next scan line SLn configured to transfer a next scan signal Sn+1.

The driving voltage line PL is configured to transfer the driving voltage ELVDD to the first transistor T1. First and second initialization voltage lines 145 and 165 may be configured to transfer first and second initialization voltages Vint1 and Vint2, respectively.

The first transistor T1 may be a driving transistor. A first gate electrode (e.g., a first control electrode) of the first transistor T1 may be connected to the storage capacitor Cst. A first electrode of the first transistor T1 may be electrically connected to the driving voltage line PL through the fifth transistor T5, and a second electrode of the first transistor T1 may be electrically connected to a first electrode (e.g., an anode) of the light-emitting diode ED through the sixth transistor T6. One of the first electrode and the second electrode of the first transistor T1 may be a source electrode, and the other may be a drain electrode. The first transistor T1 may be configured to supply a driving current $I_d$ to the light-emitting diode ED according to a switching operation of the second transistor T2.

The second transistor T2 may be a switching transistor. A second gate electrode (e.g., a second control electrode) of the second transistor T2 is connected to the first scan line SL1. A first electrode of the second transistor T2 is connected to the data line DL, and a second electrode of the second transistor T2 is connected to the first electrode of the first transistor T1 and electrically connected to the driving voltage line PL through the fifth transistor T5. One of the first electrode and the second electrode of the second transistor T2 may be a source electrode, and the other may be a drain electrode. The second transistor T2 may be turned on according to the first scan signal Sn transferred through the first scan line SL1, and may perform a switching operation of transferring a data signal Dm transferred through the data line DL to the first electrode of the first transistor T1.

The third transistor T3 may be a compensation transistor configured to compensate for a threshold voltage of the first transistor T1. A third gate electrode (e.g., a compensation control electrode) of the third transistor T3 is connected to the second scan line SL2. A first electrode of the third transistor T3 is connected to a lower electrode CE1 of the storage capacitor Cst through a node connection line 166, and connected to the first gate electrode of the first transistor T1. The first electrode of the third transistor T3 may also be connected to the fourth transistor T4. A second electrode of the third transistor T3 is connected to the second electrode of the first transistor T1, and electrically connected to the first electrode (e.g., the anode) of the light-emitting diode ED through the sixth transistor T6. One of the first electrode and the second electrode of the third transistor T3 may be a source electrode, and the other may be a drain electrode.

The third transistor T3 may be turned on according to the second scan signal Sn' transferred through the second scan line SL2, and may diode-connect the first transistor T1 by electrically connecting the first gate electrode to the second electrode of the first transistor T1.

The fourth transistor T4 may be a first initialization transistor configured to initialize the first gate electrode of the first transistor T1. A fourth gate electrode (e.g., a fourth control electrode) of the fourth transistor T4 is connected to the previous scan line SLp. A first electrode of the fourth transistor T4 is connected to the first initialization voltage line 145. A second electrode of the fourth transistor T4 may be connected to the lower electrode CE1 of the storage capacitor Cst, the first electrode of the third transistor T3, and the first gate electrode of the first transistor T1. One of the first electrode and the second electrode of the fourth transistor T4 may be a source electrode, and the other may be a drain electrode. The fourth transistor T4 may be turned on according to the previous scan signal Sn−1 received through the previous scan line SLp, and may perform an initialization operation of initializing the voltage of the first gate electrode of the first transistor T1 by transferring the first initialization voltage Vint1 to the first gate electrode of the driving transistor T1.

The fifth transistor T5 may be an operation control transistor. A fifth gate electrode (e.g., a fifth control electrode) of the fifth transistor T5 is connected to the emission control line EL. A first electrode of the fifth transistor T5 is connected to the driving voltage line PL, and a second electrode of the fifth transistor T5 is connected to the first electrode of the first transistor T1 and the second electrode of the second transistor T2. One of the first electrode and the second electrode of the fifth transistor T5 may be a source electrode, and the other may be a drain electrode.

The sixth transistor T6 may be an emission control transistor. A sixth gate electrode (e.g., a sixth control electrode) of the sixth transistor T6 is connected to the emission control line EL. A first electrode of the sixth transistor T6 is connected to the second electrode of the first transistor T1 and the second electrode of the third transistor T3, and a second electrode of the sixth transistor T6 is electrically connected to a second electrode of the seventh transistor T7 and the first electrode (e.g., the anode) of the light-emitting diode ED. One of the first electrode and the second electrode of the sixth transistor T6 may be a source electrode, and the other may be a drain electrode.

The fifth transistor T5 and the sixth transistor T6 may be concurrently (e.g., simultaneously or substantially simultaneously) turned on according to the emission control signal En transferred through the emission control line EL. When the fifth transistor T5 and the sixth transistor T6 are turned on, the driving voltage ELVDD is transferred to the light-emitting diode ED, and the driving current $I_d$ may flow through the light-emitting diode ED.

The seventh transistor T7 may be a second initialization transistor configured to initialize the first electrode of the light-emitting diode ED. A seventh gate electrode (e.g., a seventh control electrode) of the seventh transistor T7 is connected to the next scan line SLn. A first electrode of the seventh transistor T7 is connected to the second initialization voltage line 165. The second electrode of the seventh transistor T7 is connected to the second electrode of the sixth transistor T6 and the first electrode (e.g., the anode) of the light-emitting diode ED. The seventh transistor T7 may be turned on according to the next scan signal Sn+1 transferred through the next scan line SLn, and may initialize the first electrode of the light-emitting diode ED by transferring the second initialization voltage Vint2 to the first electrode (e.g., the anode) of the light-emitting diode ED. While FIG. 4 shows that the seventh transistor T7 is connected to the next scan line SLn, the present disclosure is not limited thereto, and the seventh transistor T7 may be connected to the previous scan line SLp.

The storage capacitor Cst includes the lower electrode CE1 and an upper electrode CE2. The lower electrode CE1 of the storage capacitor Cst is connected to the first gate electrode of the first transistor T1, and the upper electrode CE2 of the storage capacitor Cst is connected to the driving voltage line PL. The storage capacitor Cst may be configured to store a charge corresponding to a difference between a voltage of the first gate electrode of the first transistor T1 and the driving voltage ELVDD.

The boost capacitor Cbt includes a third electrode CE3 and a fourth electrode CE4. The third electrode CE3 may be connected to the second gate electrode of the second transistor T2 and the first scan line SL1, and the fourth electrode CE4 may be connected to the first electrode of the third transistor T3 and the node connection line 166. The boost capacitor Cbt may raise the voltage of a first node N1 when the first scan signal Sn supplied to the first scan line SL1 is turned off. When the voltage of the first node N1 is raised, a black grayscale (e.g., a black grayscale level or value) may be clearly expressed.

The first node N1 may be a region where the first gate electrode of the first transistor T1, the first electrode of the third transistor T3, the second electrode of the fourth transistor T4, and the fourth electrode CE4 of the boost capacitor Cbt are connected to each other.

In an embodiment, as shown in FIG. 4 the third and fourth transistors T3 and T4 are NMOS transistors, and the first, second, and fifth to seventh transistors T1, T2, T5, T6, and T7 are PMOS transistors. The first transistor T1 may directly influence the brightness of the display apparatus, and thus, may include a semiconductor layer including polycrystalline silicon having high reliability. Accordingly, a high-resolution display apparatus may be implemented through such a configuration.

While FIG. 4 shows that the third and fourth transistors T3 and T4 are NMOS transistors, in another embodiment, the first to seventh transistors T1, T2, T3, T4, T5, T6, and T7 may be PMOS transistors. In this case, the second and third transistors T2 and T3 may be electrically connected to the same scan line as each other. In an embodiment, the fourth and seventh transistors T4 and T7 may be electrically connected to the same scan line as each other. In an embodiment, the fourth and seventh transistors T4 and T7 may be electrically connected to the same initialization voltage line as each other.

Figure 5:
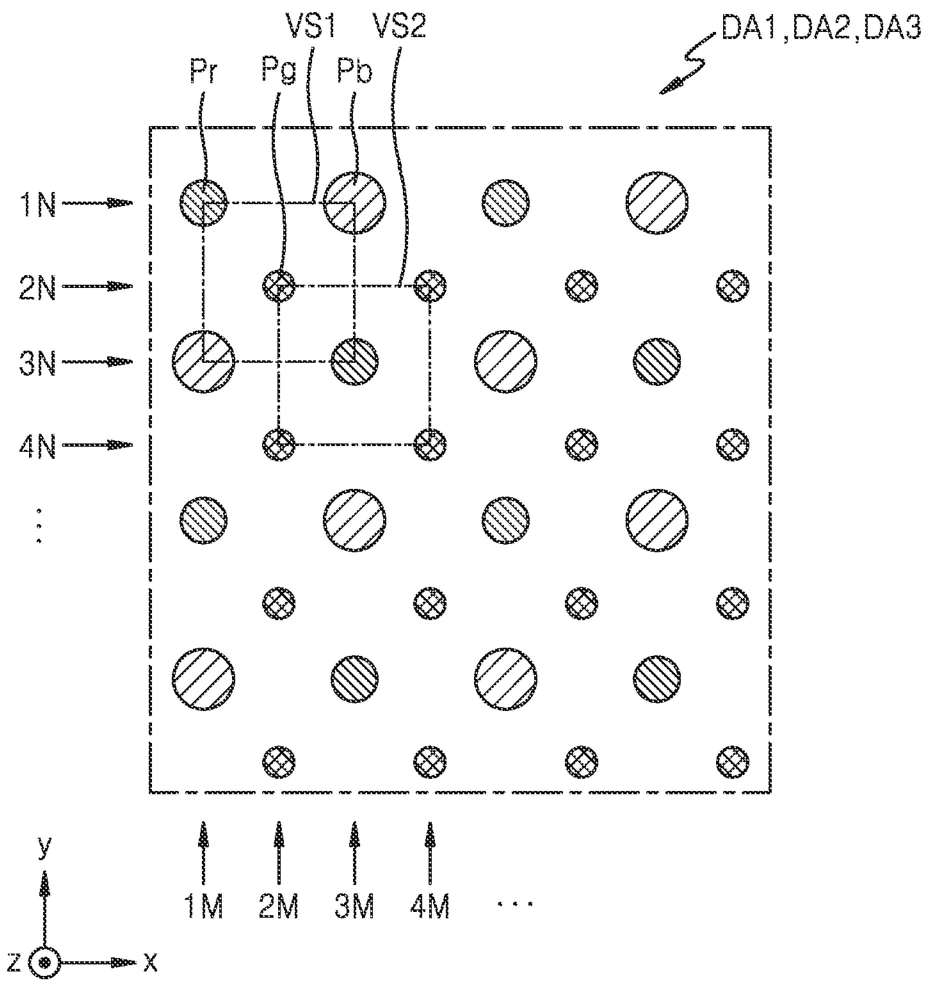
FIG. 5 is a plan view of sub-pixels arranged in a display area of a display panel according to an embodiment.

FIG. 5 is a plan view of sub-pixels arranged in a display area of the display panel 10 according to an embodiment. Referring to FIG. 5, red, green, and blue sub-pixels Pr, Pg, and Pb arranged at (e.g., in or on) the first to third display areas DA1, DA2, and D3 may have the same or substantially the same configuration as each other in a plan view.

In an embodiment, the first to third display areas DA1, DA2, and D3 may have the same or substantially the same resolution as each other. In other words, the number and/or area of sub-pixels arranged at (e.g., in or on) the first display area DA1 per unit area, the number and/or area of sub-pixels arranged at (e.g., in or on) the second display area DA2 per unit area, and the number and/or area of sub-pixels arranged at (e.g., in or on) the third display area DA3 per unit area may be the same or substantially the same as each other.

In an embodiment, referring to FIG. 5, the red sub-pixel Pr, the green sub-pixel Pg, and the blue sub-pixel Pb may be arranged in a diamond shape or arrangement (e.g., a PENTILE® shape or arrangement, PENTILE® being a duly registered trademark of Samsung Display Co., Ltd.). In FIG. 5, a plurality of rows (e.g., 1N, 2N, 3N, 4N, . . . ) of the sub-pixels, and a plurality of columns (e.g., 1M, 2M, 3M, 4M, . . . ) of the sub-pixels are illustrated for convenience, but the present disclosure is not limited to the number of rows and the number of columns shown in FIG. 5.

As an example, a plurality of red sub-pixels Pr and a plurality of blue sub-pixels Pb are alternately arranged in a first row 1N, a plurality of green sub-pixels Pg are arranged at a suitable interval (e.g., a predetermined or preset interval) in an adjacent second row 2N, a plurality of blue sub-pixels Pb and a plurality of red sub-pixels Pr are alternately arranged in an adjacent third row 3N, and a plurality of green sub-pixels Pg are arranged at a suitable interval (e.g., a predetermined or preset interval) in an adjacent fourth row 4N. The sub-pixel arrangement is repeated. In an embodiment, the size (or the width) of each of the blue sub-pixel Pb and the red sub-pixel Pr may be greater than the size (or the width) of the green sub-pixel Pg. The size (or the width) of the blue sub-pixel Pb may be the same or substantially the same as the size (or the width) of the red sub-pixel Pr, or may be different from the size (or the width) of the red sub-pixel Pr.

The plurality of red sub-pixels Pr and the plurality of blue sub-pixels Pb in the first row 1N, and the plurality of green sub-pixels Pg in the second row 2N are arranged in a staggered manner. Accordingly, the red sub-pixels Pr and the blue sub-pixels Pb are alternately arranged in a first column 1M, the plurality of green sub-pixels Pg are spaced apart from each other at a suitable interval (e.g., a predetermined or preset interval) in an adjacent second column 2M, the blue sub-pixels Pb and the red sub-pixels Pr are alternately arranged in an adjacent third column 3M, and the plurality of green sub-pixels Pg are spaced apart from each other at a suitable interval (e.g., a predetermined or preset interval) in an adjacent fourth column 4M. The sub-pixel arrangement is repeated.

In the sub-pixel arrangement, from among the vertexes of a first virtual quadrangle VS1 having a center at a green sub-pixel Pg as the center of the quadrangle, red sub-pixels Pr are arranged on first and third vertexes, respectively, located in a diagonal direction of the first virtual quadrangle VS1, and blue sub-pixels are arranged on second and fourth vertexes, respectively, which are the remainder of the vertexes of the first virtual quadrangle VS1.

In other words, in the sub-pixel arrangement, from among the vertexes of a second virtual quadrangle VS2 having a center at a red sub-pixel Pr or a blue sub-pixel Pb as the center of the quadrangle, green sub-pixels Pg are arranged on the vertexes, respectively, of the second virtual quadrangle VS2. The first and second virtual quadrangles VS1 and VS2 may have various suitable shapes, for example, such as a rectangle, a rhombus, a square, or the like, and various suitable modifications may be made.

Such a sub-pixel arrangement structure is referred to as a diamond-type or a diamond-shape (e.g., a PENTILE® type or shape). A rendering operation for representing a color by sharing adjacent sub-pixels may be applied in the diamond-type, and thus, high resolution may be implemented by using a smaller number of sub-pixels.

Figure 6:
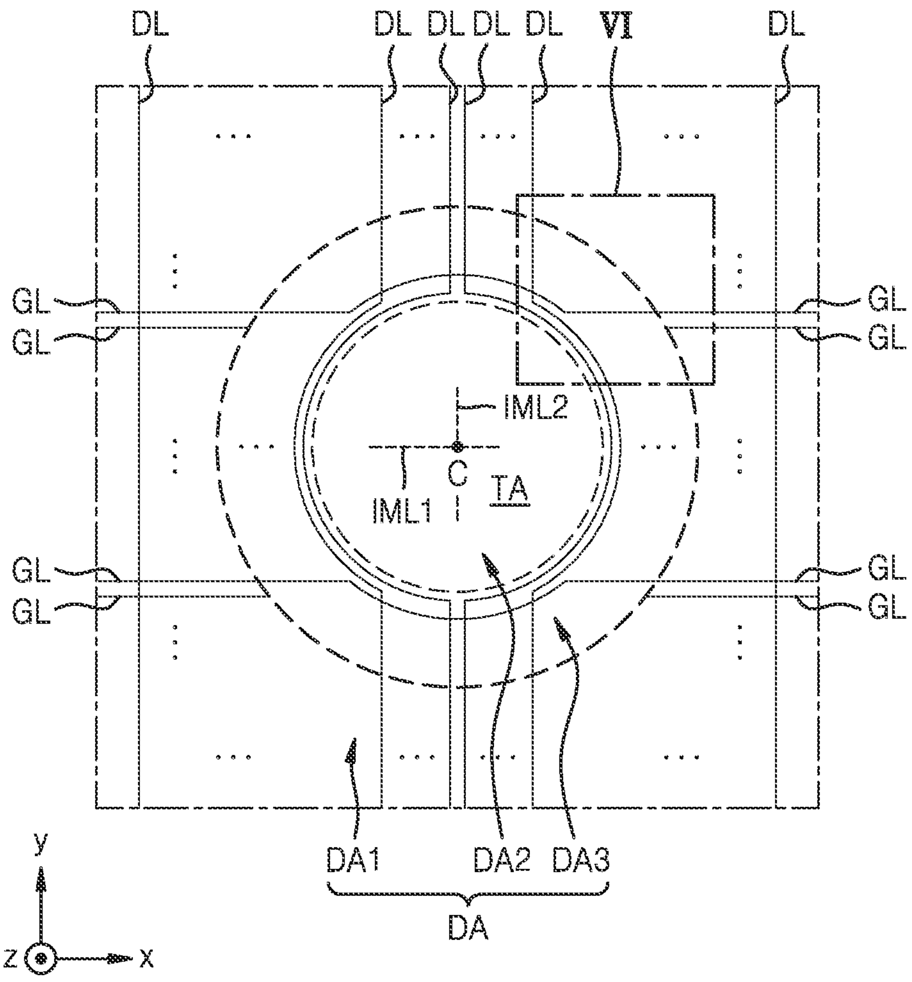
FIG. 6 is a plan view of a portion of a display panel according to an embodiment.

FIG. 6 is a plan view of a portion of a display panel according to an embodiment. For convenience of illustration, FIG. 6 shows some signal lines passing across the display area DA, for example, such as the data lines DL and the gate lines GL.

Referring to FIG. 6, the gate lines GL may each extend in the first direction (e.g., the x direction). Some of the gate lines GL may be bent or curved along an outer side (e.g., a periphery) of the second display area DA2 at (e.g., in or on) the third display area DA3. As an example, one of the gate lines GL may be bent or curved along an upper side of the second display area DA2 at (e.g., in or on) the third display area DA3, and another of the gate lines GL may be bent or curved along a lower side of the second display area DA2 at (e.g., in or on) the third display area DA3. As an example, one of the gate lines GL curved along the upper side of the second display area DA2, and the other of the gate lines GL curved along the lower side of the second display area DA2 may be symmetrical or substantially symmetrical to each other with respect to a first virtual line IML1 passing through the center C of the second display area DA2.

Others of the gate lines GL may be disconnected around the second display area DA2. As an example, the gate lines GL arranged on two opposite sides with the third display area DA3 therebetween may be spaced apart (e.g., separated) from each other. In FIG. 6, the gate line GL may be the scan line SL and/or the emission control line EL that is connected to the sub-pixel circuit PC described above with reference to FIG. 4. In other words, some of the first gate lines SL1, some of the second gate line SL2, some of the previous scan lines SLp, and/or some of the emission control lines EL (e.g., see FIG. 4) may be bent or curved along the outer side of the second display area DA2 at (e.g., in or on) the third display area DA3. In addition, others of the first gate lines SL1, others of the second gate line SL2, others of the previous scan lines SLp, and/or others of the emission control lines EL (e.g., see FIG. 4) may be spaced apart from each other with the third display area DA3 therebetween.

The data lines DL may extend in the second direction (e.g., the y direction). Some of the data lines DL may be bent or curved along the outer side of the second display area DA2 at (e.g., in or on) the third display area DA3. As an example, one of the data lines DL may be bent or curved along the left side of the second display area DA2 at (e.g., in or on) the third display area DA3, and another of the data lines DL may be bent or curved along the right side of the second display area DA2 at (e.g., in or on) the third display area DA3. The one of the data lines DL curved along the left side of the second display area DA2, and the other of the data lines DL curved along the right side of the second display area DA2 may be symmetrical or substantially symmetrical to each other with respect to a second virtual line IML2.

As described above, the data line DL and the gate line GL may not pass across the second display area DA2, and thus, the transmissive area TA may be sufficiently secured.

Figure 7:
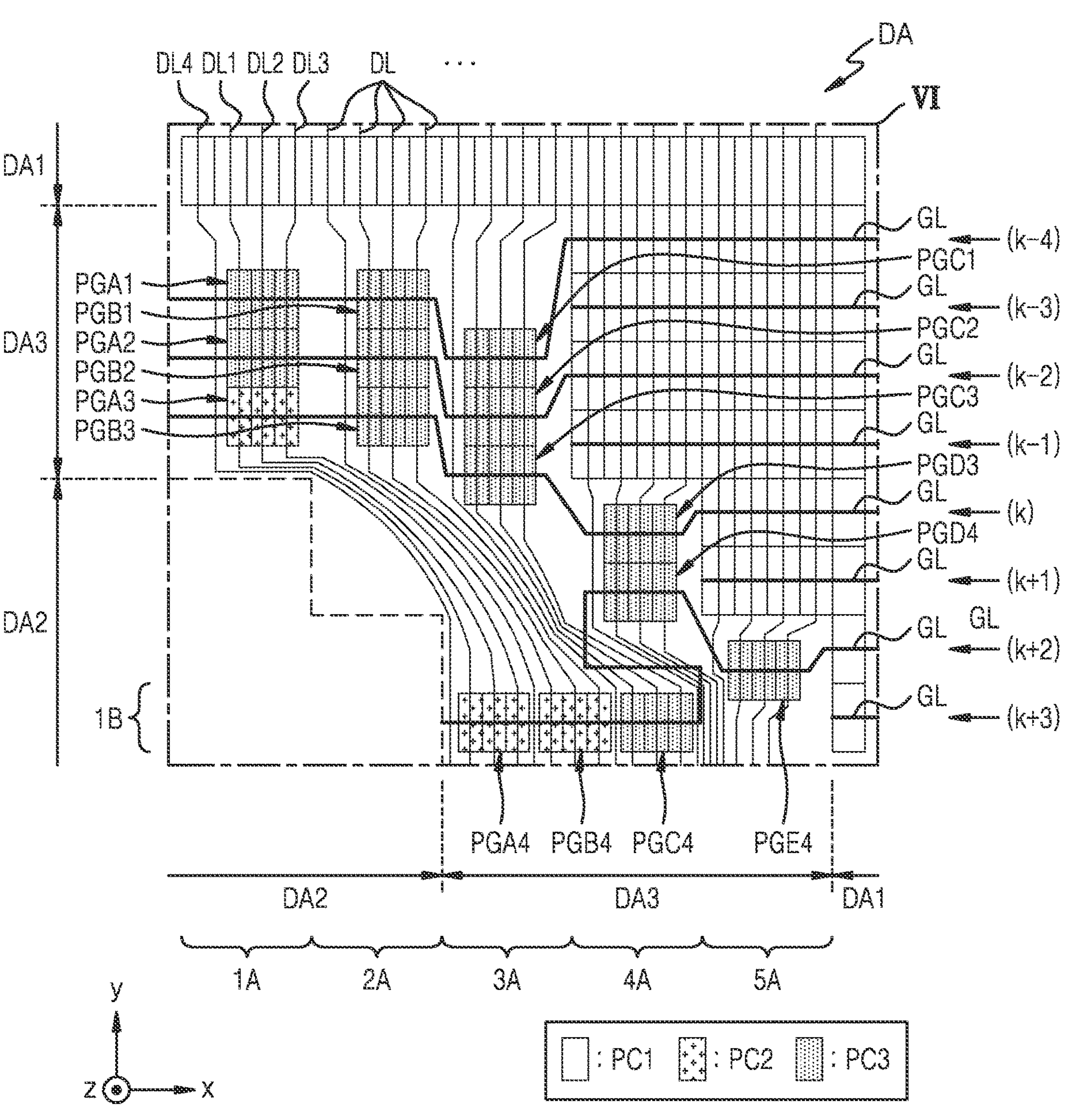
FIG. 7 is an enlarged view of a portion of a display panel according to an embodiment, and shows sub-pixel circuits and signal lines of the region VI of FIG. 6.
Figure 8:
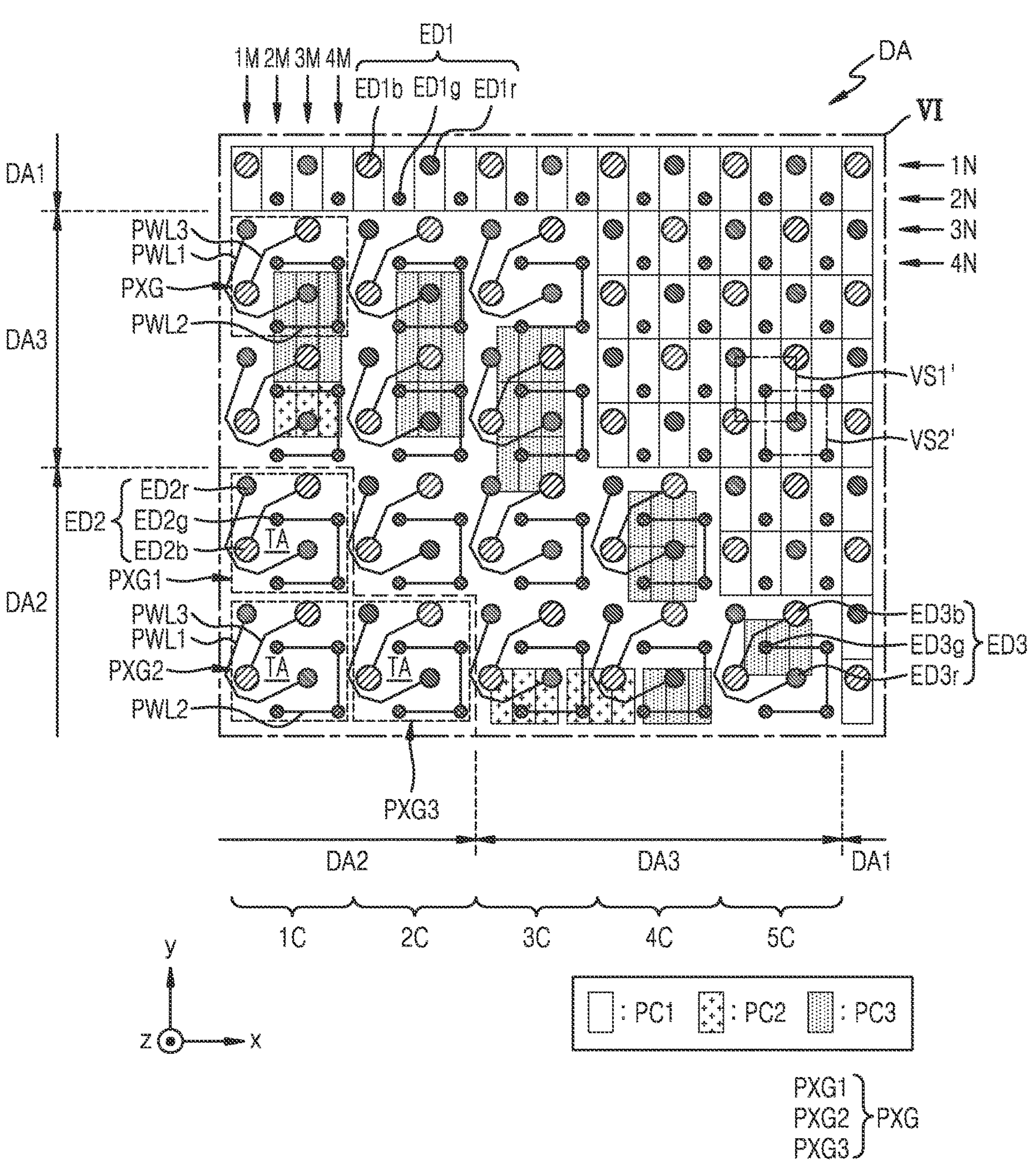
FIG. 8 is an enlarged view of a portion of a display panel according to an embodiment, and shows sub-pixel circuits and light-emitting diodes of the region VI of FIG. 6.

FIGS. 7 and 8 are plan views of a portion of the display panel 10 according to one or more embodiments, and show an enlarged view of the region VI of FIG. 6. For convenience of illustration, FIG. 7 shows sub-pixel circuits and signal lines, and FIG. 8 shows light-emitting diodes electrically connected to the sub-pixel circuits shown in FIG. 7. For convenience of illustration, the signal lines shown in FIG. 7 are not illustrated in FIG. 8.

Referring to FIG. 7, the sub-pixel circuits are arranged at (e.g., in or on) the first display area DA1 and the third display area DA3, but not at (e.g., in or on) the second display area DA2.

The sub-pixel circuits, for example, such as the first sub-pixel circuits PC1 arranged at (e.g., in or on) the first display area DA1, may be arranged to form a row and a column at (e.g., in or on) the first display area DA1. The first sub-pixel circuits PC1 may be arranged at a suitable interval (e.g., a predetermined or preset interval) in the first direction (e.g., the x direction) and the second direction (e.g., the y direction). In an embodiment, the first sub-pixel circuits PC1 that are adjacent to the third display area DA3 may be arranged to have a stepwise configuration in a plan view. In FIG. 7, the rows of the first sub-pixel circuits PC1 are represented with the reference symbols (k−4), (k−3), (k−2), (k−1), (k), (k+1), (k+2), and (k+3).

The sub-pixel circuits arranged at (e.g., in or on) the third display area DA3 may also be arranged to form rows and columns. The sub-pixel circuits, for example, such as the second sub-pixel circuits PC2 and the third sub-pixel circuits PC3 arranged at (e.g., in or on) the third display area DA3, may be arranged to form row and columns at (e.g., in or on) the third display area DA3. The second sub-pixel circuits PC2 and the third sub-pixel circuits PC3 may form different rows and columns from the rows and columns of the first sub-pixel circuits PC1 arranged at (e.g., in or on) the first display area DA1. As an example, three second sub-pixel circuits PC2 may form one sub-pixel circuit group, and three third sub-pixel circuits PC3 may form one sub-pixel circuit group. The sub-pixel circuit groups may be arranged to be spaced apart from each other in the first direction (e.g., the x direction) and/or the second direction (e.g., the y direction) at (e.g., in or on) the third display area DA3. In FIG. 7, the reference numerals 1A, 2A, 3A, 4A, and 5A represent columns of the sub-pixel circuit groups, and the reference numeral 1B represents a row of the sub-pixel circuit groups.

Some of the sub-pixel circuit groups at (e.g., in or on) the third display area DA3 may be spaced apart from the second display area DA2 in the second direction (e.g., the y direction), and others (e.g., the rest) may be spaced apart from the second display area DA2 in the first direction (e.g., the x direction). FIG. 7 shows sub-pixel circuit groups PGA1, PGA2, and PGA3 arranged in a first column 1A along the second direction (e.g., the y direction), sub-pixel circuit groups PGB1, PGB2, and PGB3 arranged in a second column 2A, sub-pixel circuit groups PGC1, PGC2, and PGC3 arranged in a third column 3A, sub-pixel circuit groups PGD3 and PGD4 arranged in a fourth column 4A, a sub-pixel circuit group PGE4 arranged in a fifth column 5A, and sub-pixel circuit groups PGA4, PGB4, and PGC4 arranged in a first row 1B along the first direction (e.g., the x direction).

The sub-pixel circuit groups PGA1, PGA2, and PGA3 arranged in the first column 1A may be adjacent to each other in the second direction (e.g., the y direction), and spaced apart, in the first direction (e.g., the x direction), from the sub-pixel circuit groups PGB1, PGB2, and PGB3 arranged in the second column 2A. The sub-pixel circuit groups PGB1, PGB2, and PGB3 arranged in the second column 2A may be adjacent to each other in the second direction (e.g., the y direction), and spaced apart, in the first direction (e.g., the x direction), from the sub-pixel circuit groups PGC1, PGC2, and PGC3 arranged in the third column 3A. The sub-pixel circuit groups PGC1, PGC2, and PGC3 arranged in the third column 3A may be adjacent to each other in the second direction (e.g., the y direction), and spaced apart, in the first direction (e.g., the x direction), from the sub-pixel circuit groups PGD3 and PGD4 arranged in the fourth column 4A. The sub-pixel circuit groups PGD3 and PGD4 arranged in a fourth column 4A may be adjacent to each other in the second direction (e.g., the y direction), and spaced apart, in the first direction (e.g., the x direction), from the sub-pixel circuit group PGE4 arranged in the fifth column 5A. The sub-pixel circuit groups PGA4, PGB4, and PGC4 arranged in the first row 1B may be adjacent to each other in the first direction (e.g., the x direction).

Sub-pixel circuits closer to the first display area DA1, from among the sub-pixel circuits arranged at (e.g., in or on) the third display area DA3, may be arranged to have a stepwise configuration in a plan view. As an example, as shown in FIG. 7, the third sub-pixel circuits PC3 arranged relatively at (e.g., in or on) the outer region of the third display area DA3 may have the stepwise configuration in a plan view.

Signal lines, for example, such as the data lines DL and the gate lines GL, may be connected to each other in the first sub-pixel circuits PC1 at (e.g., in or on) the first display area DA1 and the second and third sub-pixel circuits PC2 and PC3 at (e.g., in or on) the third display area DA3.

One of the data lines (referred to as a first data line DL1, hereinafter) electrically connected to the first sub-pixel circuit PC1 may be electrically connected to the third sub-pixel circuit PC3 and the second sub-pixel circuit PC2 in the same column at (e.g., in or on) the third display area DA3. A portion of the first data line DL1 may be located at (e.g., in or on) the third display area DA3, and may be bent or curved to partially surround (e.g., around a periphery of) the second display area DA2 in a plan view. The first data line DL1 may be electrically connected to one of the sub-pixel circuits, for example, such as the second sub-pixel circuit PC2, arranged in the first row 1B. In other words, the second sub-pixel circuit PC2 (e.g., one of the second sub-pixel circuits of the sub-pixel circuit group PGA4) that is spaced apart from the second display area DA2 in the first direction (e.g., the x direction) and the second sub-pixel circuit PC2 (e.g., one of the second sub-pixel circuits of the sub-pixel circuit group PGA3) that is spaced apart from the second display area DA2 in the second direction (e.g., the y direction) may be electrically connected to the first data line DL1.

Similarly, another data line (referred to as a second data line DL2, hereinafter) electrically connected to the first sub-pixel circuit PC1 may be electrically connected to the third sub-pixel circuit PC3 and the second sub-pixel circuit PC2 in the same column at (e.g., in or on) the third display area DA3. A portion of the second data line DL2 may be located at (e.g., in or on) the third display area DA3, and may be bent or curved to partially surround (e.g., around a periphery of) the second display area DA2 in a plan view. The second data line DL2 may be electrically connected to one of the sub-pixel circuits, for example, such as the second sub-pixel circuit PC2, arranged in the first row 1B.

Another data line (referred to as a third data line DL3, hereinafter) may be electrically connected to the first sub-pixel circuit PC1 at (e.g., in or on) the first display area DA1, the third sub-pixel circuit PC3 and the second sub-pixel circuit PC2 arranged in the same column at (e.g., in or on) the third display area DA3, and one of the sub-pixel circuits, for example, such as the second sub-pixel circuit PC2, arranged in the first row 1B.

Another data line (referred to a fourth data line DL4, hereinafter) adjacent to the first data line DL1 may be electrically connected to the first sub-pixel circuit PC1 at (e.g., in or on) the first display area DA1, but may not be electrically connected to the sub-pixel circuit arranged at (e.g., in or on) the third display area DA3. A portion of the fourth data line DL4 may be located at (e.g., in or on) the third display area DA3, and may be bent or curved to partially surround (e.g., around a periphery of) the second display area DA2 in a plan view.

The structures of the first to fourth data lines DL1, DL2, DL3, and DL4 are applicable to other sub-pixel circuit groups arranged in another column at (e.g., in or on) the third display area DA3. As an example, three data lines DL that are electrically connected to the sub-pixel circuits in the sub-pixel circuit groups PGB1, PGB2, and PGB3 in the second column 2A may be electrically connected to the first sub-pixel circuits PC1 adjacent to the second column 2A, and electrically connected to the sub-pixel circuits of the sub-pixel circuit group PGB4 arranged in the first row 1B. In addition, one of the data lines DL may pass between the sub-pixel circuit groups PGA1, PGA2, and PGA3 in the first column 1A and the sub-pixel circuit groups PGB1, PGB2, and PGB3 in the second column 2A.

Similarly, three data lines DL electrically connected to the sub-pixel circuits in the sub-pixel circuit groups PGC1, PGC2, and PGC3 in the third column 3A may be electrically connected to the first sub-pixel circuits PC1 adjacent to the third column 3A, and electrically connected to the sub-pixel circuits of the sub-pixel circuit group PGC4 arranged in the first row 1B. In addition, one of the data lines DL may pass between the sub-pixel circuit groups PGB1, PGB2, and PGB3 in the second column 2A and the sub-pixel circuit groups PGC1, PGC2, and PGC3 in the third column 3A.

The second and/or third sub-pixel circuits PC2 and PC3 at (e.g., in or on) the third display area DA3 may be electrically connected to the gate line GL passing an even-numbered row or an odd-numbered row from among the rows of the first sub-pixel circuits PC1. In an embodiment, FIG. 7 shows that the second and/or third sub-pixel circuits PC2 and PC3 at (e.g., in or on) the third display area DA3 are electrically connected to the gate line GL passing a (k+2n)-th row and electrically connected to the (k+2n)-th row (where n is an integer).

As an example, the third sub-pixel circuits PC3 corresponding to the sub-pixel circuit groups PGA1, PGB1, and PGC1 that are adjacent to each other at (e.g., in or on) the third display area DA3 may be electrically connected to the gate line GL passing the first sub-pixel circuits PC1 in a (k−4)-th row at (e.g., in or on) the first display area DA1. In other words, the third sub-pixel circuits PC3 corresponding to the sub-pixel circuit groups PGA1, PGB1, and PGC1 at (e.g., in or on) the third display area DA3 and the first sub-pixel circuits PC1 in the (k−4)-th row may be electrically connected to the same gate line GL. The gate line GL shown in FIG. 7 denotes at least one of the first gate line SL1, the second gate line SL2, the previous scan line SLp, the next scan line SLn, and the emission control line EL described above with reference to FIG. 4.

Similarly, the third sub-pixel circuits PC3 corresponding to the sub-pixel circuit groups PGA2, PGB2, and PGC2 that are adjacent to each other at (e.g., in or on) the third display area DA3 may be electrically connected to the gate line GL passing the first sub-pixel circuits PC1 in a (k−2)-th row at (e.g., in or on) the first display area DA1. In other words, the third sub-pixel circuits PC3 corresponding to the sub-pixel circuit groups PGA2, PGB2, and PGC2 and the first sub-pixel circuits PC1 in the (k−2)-th row may be electrically connected to the same gate line GL.

The second and third sub-pixel circuits PC2 and PC3 corresponding to the sub-pixel circuit groups PGA3, PGB3, PGC3, and PGD3 that are adjacent to each other at (e.g., in or on) the third display area DA3 may be connected to the same gate line GL as that of the first sub-pixel circuits PC1 in a k-th row at (e.g., in or on) the first display area DA1.

The second sub-pixel circuits PC2 of the sub-pixel circuit groups PGA4, PGB4, and PGC4 in the first row 1B at (e.g., in or on) the third display area DA3 and the third sub-pixel circuits PC3 of the sub-pixel circuit groups PGD4 and PGE4 adjacent to the first row 1B may be connected to the same gate line GL as that of the first sub-pixel circuits PC1 in a (k+2)-th row at (e.g., in or on) the first display area DA1.

From among the gate lines GL passing across the first display area DA1, the gate lines GL that are not electrically connected to the second and third sub-pixel circuits PC2 and PC3 arranged at (e.g., in or on) the third display area DA3 may be disconnected near (e.g., adjacent to) the third display area DA3. As an example, the gate lines GL electrically connected to the first sub-pixel circuits PC1 in the (k−3)-th row, the (k−1)-th row, the (k+1)-th row, and the (k+3)-th row, respectively, at (e.g., in or on) the first display area DA1 may be disconnected at (e.g., in or on) the outside of the third display area DA3, and may not pass across the third display area DA3. In other words, one end of each of the gate lines GL passing the (k−3)-th row, the (k−1)-th row, the (k+1)-th row, and the (k+3)-th row may be located outside the third display area DA3.

The first to third sub-pixel circuits PC1, PC2, and PC3 described above with reference to FIG. 7 may be electrically connected to the first to third light-emitting diodes ED1, ED2, and ED3 shown in FIG. 8, respectively.

Referring to FIG. 8, the first to third light-emitting diodes ED1, ED2, and ED3 may be arranged at (e.g., in or on) the first to third display areas DA1, DA2, and DA3, respectively. The first light-emitting diodes ED1 may include first red light-emitting diodes ED1*r*, first green light-emitting diodes ED1*g*, and first blue light-emitting diodes ED1*b*. The second light-emitting diodes ED2 may include second red light-emitting diodes ED2*r*, second green light-emitting diodes ED2*g*, and second blue light-emitting diodes ED2*b*. The third light-emitting diodes ED3 may include third red light-emitting diodes ED3*r*, third green light-emitting diodes ED3*g*, and third blue light-emitting diodes ED3*b*.

A configuration of the red, green, and blue light-emitting diodes at (e.g., in or on) the display area DA may be the same or substantially the same as the configuration of the red, green, and blue sub-pixels described above with reference to FIG. 5. As shown in FIG. 8, a configuration of the first light-emitting diodes ED1 at (e.g., in or on) the first display area DA1, a configuration of the second light-emitting diodes ED2 at (e.g., in or on) the second display area DA2, and a configuration of the third light-emitting diodes ED3 at (e.g., in or on) the third display area DA3 may be the same or substantially the same as each other. Accordingly, the resolutions of the first to third display areas DA1, DA2, and DA3 may be the same or substantially the same as each other.

At (e.g., in or on) the display area DA, the red light-emitting diodes and the blue light-emitting diodes may be alternately arranged in a first row 1N, a plurality of green light-emitting diodes may be spaced apart from each other with a suitable interval (e.g., a predetermined or preset interval) in an adjacent second row 2N, the blue light-emitting diodes and the red light-emitting diodes may be alternately arranged in an adjacent third row 3N, and the green light-emitting diodes may be spaced apart from each other with a suitable interval (e.g., a predetermined or preset interval) in an adjacent fourth row 4N.

The red light-emitting diodes and the blue light-emitting diodes arranged in the first row 1N and the plurality of green light-emitting diodes arranged in the second row 2N may be alternately arranged. Accordingly, at (e.g., in or on) the display area DA, the red light-emitting diodes and the blue light-emitting diodes are alternately arranged in the first column 1M, the plurality of green light-emitting diodes are spaced apart from each other at a suitable interval (e.g., a predetermined or preset interval) in the adjacent second column 2M, the blue light-emitting diodes and the red light-emitting diodes may be alternately arranged in the adjacent third column 3M, and the plurality of green light-emitting diodes are spaced apart from each other at a suitable interval (e.g., a predetermined or preset interval) in the adjacent fourth column 4M. The sub-pixel arrangement is repeated.

In other words, as an example, first red light-emitting diodes ED1*r* may be arranged on first and third vertexes, respectively, located in a diagonal direction from among the vertexes of a first virtual quadrangle VS1' having a green light-emitting diode ED1*g* centered at the center of the quadrangle, and first blue light-emitting diodes may be arranged on second and fourth vertexes, respectively, which are the rest of the vertexes of the first virtual quadrangle VS1'. In this case, the first green light-emitting diode ED1*g* is arranged at (e.g., in or on) the first display area DA1. As another example, the configuration structure of the first light emitting diodes ED1 may include the first green light-emitting diodes ED1*g* that are arranged on four vertexes, respectively, of a second virtual quadrangle VS2' having the first red light-emitting diode ED1*r* or the first blue light-emitting diode ED1*b* centered at the center of the quadrangle.

The configuration of the second red light-emitting diode ED2*r*, the second green light-emitting diode ED2*g*, and the second blue light-emitting diode ED2*b* at (e.g., in or on) the second display area DA2 may be the same or substantially the same as the configuration of the first red light-emitting diode ED1*r*, the first green light-emitting diode ED1*g*, and the first blue light-emitting diode ED1*b*. As an example, second red light-emitting diodes ED2*r* may be arranged on vertexes, respectively, located in a first diagonal direction from among the vertexes of a first virtual quadrangle having a second green light-emitting diode ED2*g* centered at the center of the quadrangle, and second blue light-emitting diodes may be arranged on vertexes, respectively, in a second diagonal direction of the first virtual quadrangle. The second green light-emitting diodes ED2*g* may be arranged on four vertexes, respectively, of the second virtual quadrangle having the second red light-emitting diode ED2*r* or the second blue light-emitting diode ED2*b* centered at the center of the quadrangle.

The configuration of the third red light-emitting diode ED3*r*, the third green light-emitting diode ED3*g*, and the third blue light-emitting diode ED3*b* at (e.g., in or on) the third display area DA3 may be the same or substantially the same as the configuration of the first red light-emitting diode ED1*r*, the first green light-emitting diode ED1*g*, and the first blue light-emitting diode ED1*b*. As an example, third red light-emitting diodes ED3*r* may be arranged on vertexes, respectively located in the first diagonal direction from among the vertexes of the first virtual quadrangle having a third green light-emitting diode ED3*g* centered at the center of the quadrangle, and third blue light-emitting diodes may be arranged on vertexes, respectively, in the second diagonal direction of the first virtual quadrangle. In addition, the third green light-emitting diodes ED3*g* may be arranged on four vertexes, respectively, of the second virtual quadrangle having the third red light-emitting diode ED3*r* or the third blue light-emitting diode ED3*b* centered at the center of the quadrangle. The first light-emitting diodes ED1 at (e.g., in or on) the first display area DA1 may be electrically connected to the first sub-pixel circuits PC1 at (e.g., in or on) the first display area DA1. As an example, one first light-emitting diode ED1 may correspond to one first sub-pixel circuit PC1 (e.g., in a one-to-one correspondence). As an example, a first red light-emitting diode ED1*r* may be electrically connected to a corresponding first sub-pixel circuit PC1, a first green light-emitting diode ED1*g* may be electrically connected to a corresponding first sub-pixel circuit PC1, and a first blue light-emitting diode ED1*b* may be electrically connected to a corresponding first sub-pixel circuit PC1.

The second and third light-emitting diodes ED2 and ED3 arranged at (e.g., in or on) the second display area DA2 and the third display area DA3, respectively, may be electrically connected to the sub-pixel circuits arranged at (e.g., in or on) the third display area DA3. In FIG. 8, for convenience of illustration and ease of description, the light-emitting diodes (e.g., the light-emitting diodes arranged at (e.g., in or on) the second display area DA2 and the third display area DA3) that are electrically connected to the sub-pixel circuit groups at (e.g., in or on) the third display area DA3 are denoted (e.g., are referred to) as a light-emitting diode group PXG. Each light-emitting diode group PXG may include two red light-emitting diodes, two blue light-emitting diodes, and four green light-emitting diodes. As an example, each light-emitting diode group PXG arranged at (e.g., in or on) the second display area DA2 may include two second red light-emitting diodes ED2*r*, four second green light-emitting diodes ED2*g*, and two second blue light-emitting diodes ED2*b*. As an example, each light-emitting diode group PXG arranged at (e.g., in or on) the third display area DA3 may include two third red light-emitting diodes ED3*r*, four third green light-emitting diodes ED3*g*, and two third blue light-emitting diodes ED3*b*. In FIG. 8, reference numerals 1C, 2C, 3C, 4C, and 5C denote columns of the light-emitting diode groups PXG.

The light-emitting diode groups PXG arranged in the first column 1C may be electrically connected to the sub-pixel circuit groups PGA1, PGA2, PGA3, and PGA4 described above with reference to FIG. 7. From among the light-emitting diode groups PXG in the first column 1C shown in FIG. 8, some light-emitting diode groups PXG arranged at (e.g., in or on) the third display area DA3 may be electrically connected to the sub-pixel circuit groups PGA1 and PGA2 at (e.g., in or on) the first column 1A shown in FIG. 7, respectively. From among the light-emitting diode groups PXG in the first column 1C shown in FIG. 8, first and second light-emitting diode groups PXG1 and PXG2 arranged at (e.g., in or on) the second display area DA2 may be electrically connected to the sub-pixel circuit group PGA3 in the first column 1A and the sub-pixel circuit group PGA4 in the first row 1B shown in FIG. 7, respectively.

The light-emitting diode groups PXG arranged in the second column 2C may be electrically connected to the sub-pixel circuit groups PGB1, PGB2, PGB3, and PGB4 described above with reference to FIG. 7, respectively. From among the light-emitting diode groups PXG in the second column 2C shown in FIG. 8, light-emitting diode groups PXG arranged at (e.g., in or on) the third display area DA3 may be electrically connected to the sub-pixel circuit groups PGB1, PGB2, and PGB3 in the second column 2A shown in FIG. 7, respectively. From among the light-emitting diode groups PXG in the second column 2C shown in FIG. 8, the third light-emitting diode group PXG3 arranged at (e.g., in or on) the second display area DA2 may be electrically connected to the sub-pixel circuit group PGA4 in the first row 1B shown in FIG. 7.

The light-emitting diode groups PXG arranged in the third column 3C may be electrically connected to the sub-pixel circuit groups PGC1, PGC2, PGC3, and PGC4 described above with reference to FIG. 7, respectively.

From among the light-emitting diode groups PXG in the third column 3C shown in FIG. 8, light-emitting diode groups PXG arranged at (e.g., in or on) the third display area DA3 may be electrically connected to the sub-pixel circuit groups PGC1, PGC2, and PGC3 in the third column 3A and the sub-pixel circuit group PGC4 in the first row 1B shown in FIG. 7, respectively.

The light-emitting diode groups PXG arranged in the fourth column 4C may be electrically connected to the sub-pixel circuit groups PGD3 and PGD4 described above with reference to FIG. 7, respectively.

From among the light-emitting diode groups PXG in the fourth column 4C shown in FIG. 8, the light-emitting diode groups PXG arranged at (e.g., in or on) the third display area DA3 may be electrically connected to the sub-pixel circuit groups PGD3 and PGD4 in the fourth column 4A shown in FIG. 7, respectively.

The light-emitting diode groups PXG arranged in the fifth column 5C may be electrically connected to the sub-pixel circuit group PGE4 described above with reference to FIG. 7, respectively. The light-emitting diode group PXG in the fifth column 5C arranged at (e.g., in or on) the third display area DA3 shown in FIG. 8 may be electrically connected to the sub-pixel circuit group PGE4 in the fifth column 5A shown in FIG. 7.

Referring to FIGS. 7 and 8, each sub-pixel circuit group arranged at (e.g., in or on) the third display area DA3 includes three sub-pixel circuits. The three sub-pixel circuits may each be electrically connected to the plurality of second or third light-emitting diodes (e.g., in a one-to-many correspondence). As an example, from among the three sub-pixel circuits of each sub-pixel circuit group shown in FIG. 7, one sub-pixel circuit may be electrically connected to two red light-emitting diodes (e.g., in a one-to-two correspondence) connected by a first connection line PWL1, another sub-pixel circuit may be electrically connected to four green light-emitting diodes (e.g., in a one-to-four correspondence) connected by a second connection line PWL2, and another sub-pixel circuit may be electrically connected to two blue light-emitting diodes (e.g., in a one-to-two correspondence) connected by a third connection line PWL3.

Referring to FIGS. 7 and 8, one the sub-pixel circuit groups (e.g., PGA1 and PGA2) arranged in the first column 1A at (e.g., in or on) the third display area DA3 includes three third sub-pixel circuits PC3. One of the three third sub-pixel circuits PC3 may be electrically connected to one of two third red light-emitting diodes ED3*r*, and one of the third red light-emitting diodes ED3*r* may be electrically connected to the other third red light-emitting diode ED3*r* through a first connection line PWL1 including a light transmissive conductive material. As described above, the two third red light-emitting diodes ED3*r* electrically connected to each other through the first connection line PWL1 may be electrically connected to one third sub-pixel circuit PC3. Similarly, another of the three third sub-pixel circuits PC3 may be electrically connected to four third green light-emitting diodes ED3*g* connected to each other by a second connection line PWL2, and another of the three third sub-pixel circuits PC3 may be electrically connected to two third blue light-emitting diodes ED3*b* connected to each other by a third connection line PWL3. The above structure is equally applied to an electrical connection between another sub-pixel circuit group arranged at (e.g., in or on) the third display area DA3 and still another light-emitting diode group arranged at (e.g., in or on) the third display area DA3.

As shown in FIG. 7, the sub-pixel circuit group PGA3 arranged in the first column 1A at (e.g., in or on) the third display area DA3 and adjacent to the second display area DA2 may include three second sub-pixel circuits PC2. The sub-pixel circuit group PGA4 arranged in the first row 1B at (e.g., in or on) the third display area DA3 and adjacent to the second display area DA2 may include three second sub-pixel circuits PC2. The second sub-pixel circuits PC2 of each sub-pixel circuit group PGA3 or PGA4 adjacent to the second display area DA2 may be electrically connected to the second light-emitting diodes ED2 located at (e.g., in or on) the second display area DA2.

Three second sub-pixel circuits PC2 included in the sub-pixel circuit group PGA3 arranged in the first column 1A and adjacent to the second display area DA2 may be electrically connected to the second light-emitting diodes ED2 of the first light-emitting diode group PXG1 arranged in the first column 1C and located at (e.g., in or on) the upper side of the second display area DA2. As an example, one of three second sub-pixel circuits PC2 of the sub-pixel circuit group PGA3 may be electrically connected to two second red light-emitting diodes ED2*r* of the first light-emitting diode group PXG1, another second sub-pixel circuit PC2 may be electrically connected to four second green light-emitting diodes ED2*g* through a second conductive bus line CBL2, and another second sub-pixel circuit PC2 may be electrically connected to two second blue light-emitting diodes ED2*b*.

The second light-emitting diodes ED2 of the second light-emitting diode group PXG2 arranged below the first light-emitting diode group PXG1 may be electrically connected to three second sub-pixel circuits PC2 included in the sub-pixel circuit group PGA4 arranged in the first row 1B. As an example, one of three second sub-pixel circuits PC2 of the sub-pixel circuit group PGA4 may be electrically connected to two second red light-emitting diodes ED2*r*, another second sub-pixel circuit PC2 may be electrically connected to four second green light-emitting diodes ED2*g*, and another second sub-pixel circuit PC2 may be electrically connected to two second blue light-emitting diodes ED2*b*.

The second light-emitting diodes ED2 of the third light-emitting diode group PXG3 arranged adjacent to the second light-emitting diode group PXG2 may be electrically connected to three second sub-pixel circuits PC2 included in the sub-pixel circuit group PGB4 arranged in the first row 1B.

The second sub-pixel circuits PC2 arranged at (e.g., in or on) the third display area DA3 may be electrically connected to the second light-emitting diodes ED2 arranged at (e.g., in or on) the second display area DA2 through a conductive bus line extending from the third display area DA3 toward the second display area DA2. The conductive bus lines are described in more detail below with reference to FIG. 9.

Figure 9:
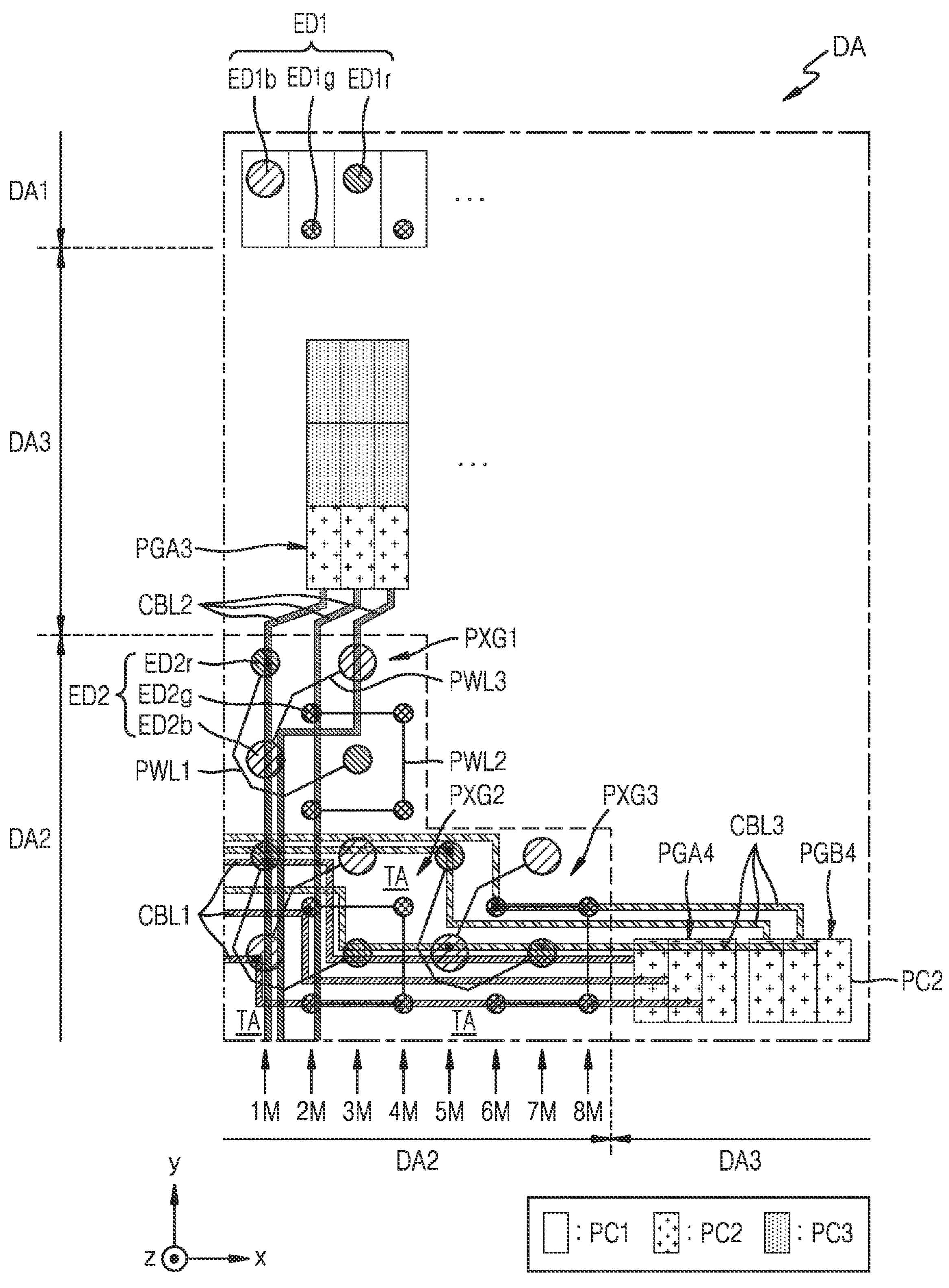
FIG. 9 is a plan view of a portion of a display panel according to an embodiment.

FIG. 9 is a plan view of a portion of the display panel according to an embodiment, and shows a portion of the display panel illustrated in FIG. 8. In FIG. 9, for convenience of illustration, the light-emitting diodes arranged at (e.g., in or on) the first and third display areas DA1 and DA3 of the display area DA are not shown.

Referring to FIG. 9, one of the second light-emitting diodes ED2 arranged at (e.g., in or on) the second display area DA2 may be electrically connected to the second sub-pixel circuit PC2 spaced apart in the first direction (e.g., the x direction) from the second display area DA2. Another second light-emitting diode ED2 arranged at (e.g., in or on) the second display area DA2 may be electrically connected to the second sub-pixel circuit PC2 spaced apart in the second direction (e.g., the y direction) from the second display area DA2.

As an example, the second light-emitting diodes ED2 of the second light-emitting diode group PXG2 arranged in the same column as a column of the second light-emitting diodes ED2 of the first light-emitting diode group PXG1 may be electrically connected to corresponding second sub-pixel circuits PC2 through the first conductive bus line CBL1 extending in the first direction (e.g., the x direction). In addition, the second light-emitting diodes ED2 of the first light-emitting diode group PXG1 may each be electrically connected to a corresponding second sub-pixel circuit PC2 through a second conductive bus line CBL2 extending in the second direction (e.g., the y direction).

One of the second red light-emitting diodes ED2*r* corresponding to the first light-emitting diode group PXG1 and arranged in the first column 1M may be electrically connected to a second sub-pixel circuit PC2 arranged at (e.g., in or on) the third display area DA3 through the second conductive bus line CBL2 extending in the second direction (e.g., the y direction).

One of the second green light-emitting diodes ED2*g* corresponding to the first light-emitting diode group PXG1 and arranged in the second column 2M may be electrically connected to a second sub-pixel circuit PC2 arranged at (e.g., in or on) the third display area DA3 through the second conductive bus line CBL2 extending in the second direction (e.g., the y direction).

One of the second blue light-emitting diodes ED2*b* corresponding to the first light-emitting diode group PXG1 and arranged in the first column 1M may be electrically connected to a second sub-pixel circuit PC2 arranged at (e.g., in or on) the third display area DA3 through the second conductive bus line CBL2 extending in the second direction (e.g., the y direction).

One of the second red light-emitting diodes ED2*r* corresponding to the second light-emitting diode group PXG2 and arranged in the first column 1M may be electrically connected to a second sub-pixel circuit PC2 arranged at (e.g., in or on) the third display area DA3 through the first conductive bus line CBL1 extending in the first direction (e.g., the x direction).

The second sub-pixel circuits PC2 connected to the second light-emitting diodes ED2 arranged in the same column may be connected to the same data line. As an example, as described above with reference to FIG. 7, the second sub-pixel circuit (e.g., the second sub-pixel circuit PC2 of one of the sub-pixel circuit groups corresponding to PGA3) connected to the second red light-emitting diode ED2*r* corresponding to the first light-emitting diode group PXG1 may be connected to the same data line as the data line to which the second sub-pixel circuit (e.g., the second sub-pixel circuit PC2 of one of the sub-pixel circuit groups corresponding to PGA4) connected to the second red light-emitting diode ED2*r* corresponding to the second light-emitting diode group PXG2.

One of the second green light-emitting diodes ED2*g* corresponding to the second light-emitting diode group PXG2 and arranged in the second column 2M may be electrically connected to a second sub-pixel circuit PC2 arranged at (e.g., in or on) the third display area DA3 through the first conductive bus line CBL1 extending in the first direction (e.g., the x direction).

One of the second blue light-emitting diodes ED2*b* corresponding to the second light-emitting diode group PXG2 and arranged in the first column 1M may be electrically connected to a second sub-pixel circuit PC2 arranged at (e.g., in or on) the third display area DA3 through the first conductive bus line CBL1 extending in the first direction (e.g., the x direction).

The second light-emitting diodes ED2 of the second light-emitting diode group PXG2 arranged in the same column as the column of the second light-emitting diodes ED2 of the second light-emitting diode group PXG2, may be electrically connected to the second sub-pixel circuit PC2 through the third conductive bus line CBL3 extending in the first direction (e.g., the x direction).

As an example, one of the second red light-emitting diodes ED2*r* corresponding to the third light-emitting diode group PXG3 and arranged in the fifth column 5M may be electrically connected to a second sub-pixel circuit PC2 arranged at (e.g., in or on) the third display area DA3 through a third conductive bus line CBL3 extending in the first direction (e.g., the x direction).

One of the second green light-emitting diodes ED2*g* corresponding to the third light-emitting diode group PXG3 and arranged in the sixth column 6M may be electrically connected to a second sub-pixel circuit PC2 arranged at (e.g., in or on) the third display area DA3 through the third conductive bus line CBL3 extending in the first direction (e.g., the x direction).

One of the second blue light-emitting diodes ED2*g* corresponding to the third light-emitting diode group PXG3 and arranged in the fifth column 5M may be electrically connected to a second sub-pixel circuit PC2 arranged at (e.g., in or on) the third display area DA3 through the third conductive bus line CBL3 extending in the first direction (e.g., the x direction).

The first conductive bus lines CBL1 and the second conductive bus lines CBL2 may cross each other, and may partially overlap with each other at (e.g., in or on) the second display area DA2. A portion of the first conductive bus line CBL1 may overlap with a portion of the second conductive bus line CBL2, with at least one insulating layer disposed between the first conductive bus line CBL1 and the second conductive bus line CBL2.

The second conductive bus lines CBL2 and the third conductive bus lines CBL3 may cross each other, and may partially overlap with each other at (e.g., in or on) the second display area DA2. A portion of the second conductive bus line CBL2 may overlap with a portion of the third conductive bus line CBL3, with at least one insulating layer disposed between the second conductive bus line CBL2 and the third conductive bus line CBL3.

The first conductive bus line CBL1, the second conductive bus line CBL2, and the third conductive bus line CBL3 may each extend from the third display area DA3 to the second display area DA2, and a portion of each of the first conductive bus line CBL1, the second conductive bus line CBL2, and the third conductive bus line CBL3 may be located at (e.g., in or on) the second display area DA2 including the transmissive area TA. To secure a transmittance of the transmissive area TA, the first conductive bus line CBL1, the second conductive bus line CBL2, and/or the third conductive bus line CBL3 may include a light transmissive conductive material. The light transmissive conductive material may include a transparent conductive oxide (TCO). As an example, the first conductive bus line CBL1, the second conductive bus line CBL2, and/or the third conductive bus line CBL3 may include a conductive oxide, such as indium tin oxide (ITO), indium zinc oxide (IZO), zinc oxide (ZnO), indium oxide ($In_2O_3$), indium gallium oxide (IGO), indium zinc allium oxide (IZGO), or aluminum zinc oxide (AZO). Accordingly, reduction in a light transmittance of the transmissive area TA may be minimized or reduced.

The second light-emitting diodes ED2 connected to the second sub-pixel circuits PC2 may each be electrically connected to another second light-emitting diode ED2 that emits light of the same color through a connection line.

As an example, one of the second red light-emitting diodes ED2*r* corresponding to the first light-emitting diode group PXG1 and arranged in the first column 1M may be electrically connected to another second red light-emitting diode ED2*r* corresponding to the first light-emitting diode group PXG1 and arranged in the third column 3M through the first connection line PW1. Accordingly, the second red light-emitting diodes ED2*r* in the first column 1M and the third column 3M corresponding to the first light-emitting diode group PXG1 may receive the same or substantially the same signal as each other.

One of the second green light-emitting diodes ED2*g* corresponding to the first light-emitting diode group PXG1 and arranged in the second column 2M may be electrically connected to the second green light-emitting diode ED2*g* arranged in the same column and/or in a different column through the second connection line PWL2 including a light transmissive conductive material. For example, as shown in FIG. 9, the second green light-emitting diode ED2*g* arranged in the second column 2M is electrically connected to the other three second green light-emitting diodes ED2*g* arranged in the second column 2M and the fourth column 4M.

One of the second blue light-emitting diodes ED2*b* corresponding to the first light-emitting diode group PXG1 and arranged in the first column 1M may be electrically connected to the second blue light-emitting diode ED2*b* arranged in a different column through the third connection line PWL3 including a light transmissive conductive material. For example, as shown in FIG. 9, the second blue light-emitting diode ED2*b* arranged in the first column 1M in the first light-emitting diode group PXG1 is electrically connected to another second blue light-emitting diode ED2*b* arranged in the third column 3M.

The second red light-emitting diodes ED2*r* corresponding to the second light-emitting diode group PXG2 and arranged in the first column 1M and the third column 3M may be electrically connected to each other through the first connection line PWL1. The second green light-emitting diodes ED2*g* corresponding to the second light-emitting diode group PXG2 and arranged in the second column 2M and the fourth column 4M may be electrically connected to each other through the second connection line PWL2. The second blue light-emitting diodes ED2*b* corresponding to the second light-emitting diode group PXG2 and arranged in the first column 1M and the third column 3M may be electrically connected to each other through the third connection line PWL3.

The second red light-emitting diodes ED2*r* corresponding to the third light-emitting diode group PXG3 and arranged in the fifth column 5M and the seventh column 7M may be electrically connected to each other through the first connection line PWL1. The second green light-emitting diodes ED2*g* corresponding to the third light-emitting diode group PXG3 and arranged in the sixth column 6M and the eighth column 8M may be electrically connected to each other through the second connection line PWL2. The second blue light-emitting diodes ED2*b* corresponding to the third light-emitting diode group PXG3 and arranged in the fifth column 5M and the seventh column 7M may be electrically connected to each other through the third connection line PWL3.

While FIG. 9 shows that the second light-emitting diodes ED2 are electrically connected to one another through the first to third connection lines PW1, PWL2, and PWL3, the third light-emitting diodes arranged at (e.g., in or on) the third display area DA3 may be electrically connected to each other through connection lines, as described above with reference to FIG. 8.

FIG. 9 shows that the second conductive bus lines CBL2 are electrically connected to the second red, green, and blue light-emitting diodes ED2*r*, ED2*g*, and ED2*b*, respectively, and further extend beyond the corresponding second light-emitting diodes connected to the second conductive bus lines CBL2. In another embodiment, the second conductive bus lines CBL2 may each extend from a corresponding second sub-pixel circuit PC2 to only the corresponding second light-emitting diode ED2 connected to the corresponding second conductive bus line CBL2, and may not further extend beyond the corresponding second light-emitting diode ED2. In this case, the end of each second conductive bus line CBL2 may be located around (e.g., adjacent to) the corresponding second light-emitting diode ED2 connected to the corresponding second conductive bus line CBL2.

Similarly, FIG. 9 shows that the first conductive bus lines CBL1 and the third conductive bus lines CBL3 are electrically connected to the second red, green, and blue light-emitting diodes ED2*r*, ED2*g*, and ED3*b*, and each further extends beyond the corresponding second light-emitting diode connected to the corresponding first or third conductive bus lines CBL1 or CBL3. However, the present disclosure is not limited thereto. In another embodiment, the first and third conductive bus lines CBL1 and CBL3 may each extend from the corresponding second sub-pixel circuit PC2 to only the corresponding second light-emitting diode ED2 connected to the corresponding first or third conductive bus line CBL1 or CBL3, and may not further extend beyond the corresponding second light-emitting diode ED2. In this case, the end of each of the first conductive bus line and third conductive bus line CBL1 and CBL3 may be located around (e.g., adjacent to) the corresponding second light-emitting diode ED2 connected thereto.

Figure 10:
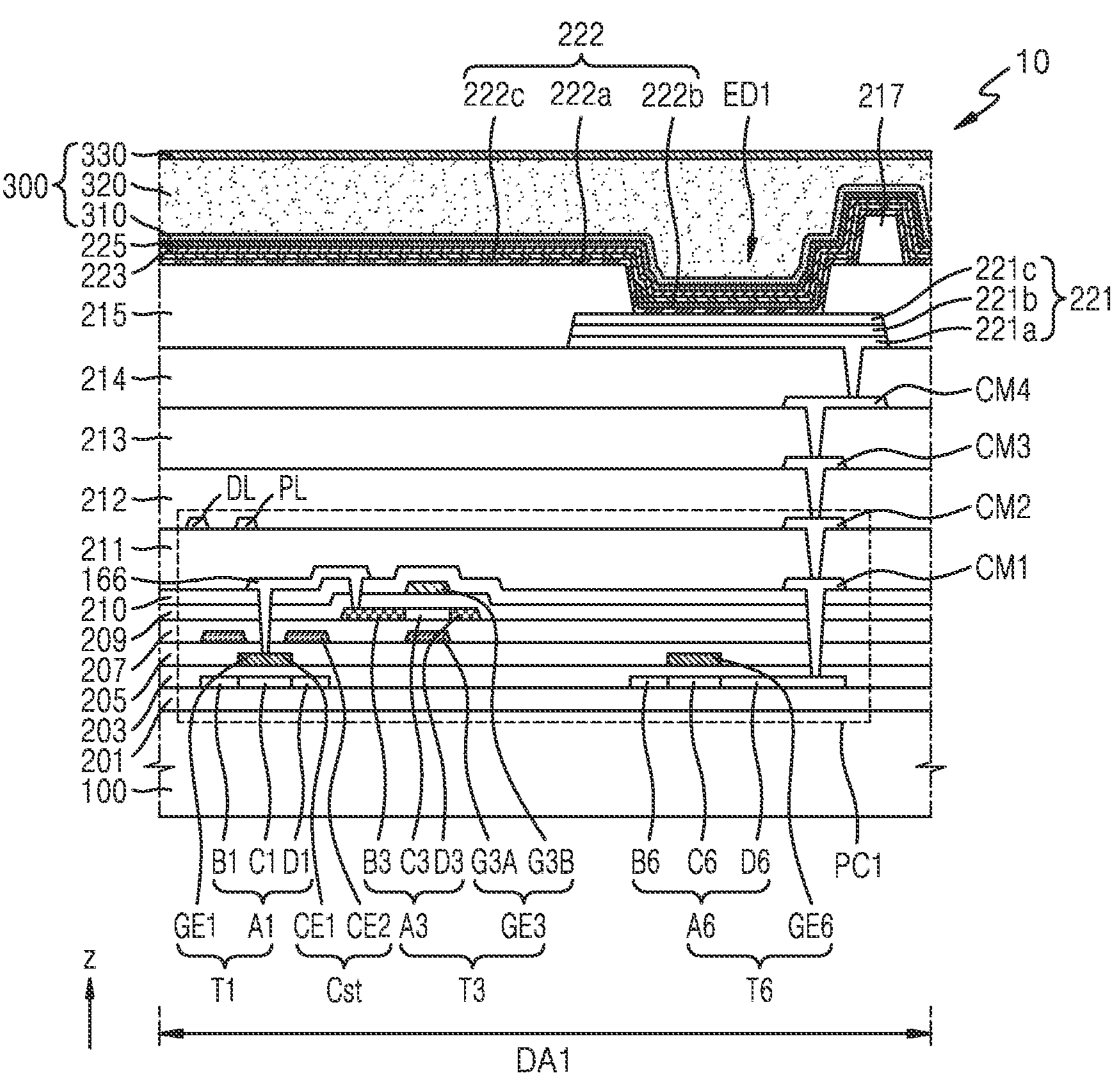
FIG. 10 is a cross-sectional view showing an electrical connection of a first light-emitting diode and a first sub-pixel circuit of a display panel according to an embodiment.

FIG. 10 is a cross-sectional view showing an electrical connection of a first light-emitting diode and a first sub-pixel circuit of a display panel according to an embodiment.

Referring to FIG. 10, the first sub-pixel circuit PC1 disposed over the substrate 100, and the first light-emitting diode ED1 disposed over the first sub-pixel circuit PC1, may be located at (e.g., in or on) the first display area DA1. The substrate 100 may include glass or a polymer resin, as described above with reference to FIG. 2.

A buffer layer 201 may be disposed on the upper surface of the substrate 100. The buffer layer 201 may prevent or substantially prevent impurities from penetrating into a semiconductor layer of a transistor. The buffer layer 201 may include an inorganic insulating material, such as silicon nitride, silicon oxynitride, and/or silicon oxide, and may have a single layer structure or a multi-layered structure including one or more of the above inorganic insulating materials.

The first sub-pixel circuit PC1 may be disposed on the buffer layer 201. As described above with reference to FIG. 4, the first sub-pixel circuit PC1 may include the plurality of transistors, and the storage capacitor. For convenience of illustration, FIG. 10 shows the first transistor T1, the third transistor T3, the sixth transistor T6, and the storage capacitor Cst.

The first transistor T1 may include a first semiconductor A1 and a first gate electrode GE1. The first semiconductor A1 is on the buffer layer 201, and the first gate electrode GE1 overlaps with a channel region C1 of the first semiconductor A1. The first semiconductor layer A1 may include a silicon-based semiconductor material, for example, such as polycrystalline silicon. The first semiconductor layer A1 may include the channel region C1, and a first region B1 and a second region D1 arranged on two opposite sides, respectively, of the channel region C1. The first region B1 and the second region D1 are regions including impurities of higher concentration than that of the channel region C1. One of the first region B1 and the second region D1 may correspond to a source region, and the other may correspond to a drain region.

The sixth transistor T6 may include a sixth semiconductor A6 and a sixth gate electrode GE6. The sixth semiconductor A6 is on the buffer layer 201, and the sixth gate electrode GE6 overlaps with a channel region C6 of the sixth semiconductor A6. The sixth semiconductor layer A6 may include a silicon-based semiconductor material, for example, such as polycrystalline silicon. The sixth semiconductor layer A6 may include the channel region C6, and a first region B6 and a second region D6 arranged on two opposite sides, respectively, of the channel region C6. The first region B6 and the second region D6 are regions including impurities of higher concentration than that of the channel region C6. One of the first region B6 and the second region D6 may correspond to a source region, and the other may correspond to a drain region.

The first gate electrode GE1 and the sixth gate electrode GE6 may include a conductive material including molybdenum (Mo), aluminum (Al), copper (Cu), and/or titanium (Ti), and may have a single-layer structure or a multi-layered structure including one or more of the above materials. A first gate insulating layer 203 may be disposed below the first gate electrode GE1 and the sixth gate electrode GE6. The first gate insulating layer 203 is for electrical insulation between the first semiconductor layer A1 and the sixth semiconductor layer A6. The first gate insulating layer 203 may include an inorganic insulating material, such as silicon nitride, silicon oxynitride, and/or silicon oxide, and may have a single layer structure or a multi-layered structure including one or more of the above inorganic insulating materials.

The storage capacitor Cst may include the lower electrode CE1 and the upper electrode CE2 overlapping with each other. In an embodiment, the lower electrode CE1 of the storage capacitor Cst may include the first gate electrode GE1. In other words, the first gate electrode GE1 may include the lower electrode CE1 of the storage capacitor Cst. As an example, the first gate electrode GE1 and the lower electrode CE1 of the storage capacitor Cst may be formed as one body (e.g., may be integrally formed).

A first interlayer insulating layer 205 may be disposed between the lower electrode CE1 and the upper electrode CE2 of the storage capacitor Cst. The first interlayer insulating layer 205 may include an inorganic insulating material, such as silicon nitride, silicon oxynitride, and/or silicon oxide, and may have a single-layer structure or a multi-layered structure including one or more of the above inorganic insulating materials.

The upper electrode CE2 of the storage capacitor Cst may include a conductive material of a low-resistance material, such as molybdenum (Mo), aluminum (Al), copper (Cu) and/or titanium (Ti), and may have a single-layer structure or a multi-layered structure including one or more of the above materials.

A second interlayer insulating layer 207 may be disposed on the storage capacitor Cst. The second interlayer insulating layer 207 may include an inorganic insulating material, such as silicon nitride, silicon oxynitride, and/or silicon oxide, and may have a single-layer structure or a multi-layered structure including one or more of the above inorganic insulating materials.

A third semiconductor layer A3 of the third transistor T3 may be disposed on the second interlayer insulating layer 207. The third semiconductor layer A3 may include an oxide-based semiconductor material. As an example, the third semiconductor layer A3 may include a Zn-oxide-based material, for example, such as Zn-oxide, In—Zn oxide, and/or Ga—In—Zn oxide. In an embodiment, the third semiconductor layer A3 may include In—Ga—Zn—O (IGZO), In—Sn—Zn—O (ITZO), or In—Ga—Sn—Zn—O (IGTZO) semiconductor containing metal, such as indium (In), gallium (Ga), and/or stannum (Sn) in ZnO.

The third semiconductor layer A3 may include a channel region C3, and a first region B3 and a second region D3 arranged on two opposite sides, respectively, of the channel region C3. One of the first region B3 and the second region D3 may correspond to a source region, and the other may correspond to a drain region.

The third transistor T3 may include a third gate electrode GE3 overlapping with the channel region C3 of the third semiconductor layer A3. The third gate electrode GE3 may have a double gate structure including a lower gate electrode G3A and an upper gate electrode G3B. The lower gate electrode G3A is disposed below (e.g., underneath) the third semiconductor layer A3, and the upper gate electrode G3B is disposed over the channel region C3.

The lower gate electrode G3A may be at (e.g., in or on) the same layer as that of the upper electrode CE2 of the storage capacitor Cst. For example, the lower gate electrode G3A and the upper electrode CE2 of the storage capacitor Cst may be arranged on the first interlayer insulating layer 205. The lower gate electrode G3A may include the same material as that of the upper electrode CE2 of the storage capacitor Cst.

The upper gate electrode G3B may be disposed over the third semiconductor layer A3, with a second gate insulating layer 209 therebetween. The second gate insulating layer 209 may include an inorganic insulating material, such as silicon nitride, silicon oxynitride, and/or silicon oxide, and may have a single-layer structure or a multi-layered structure including one or more of the above inorganic insulating materials.

A third interlayer insulating layer 210 may be disposed on the upper gate electrode G3B. The third interlayer insulating layer 210 may include an inorganic insulating material, such as silicon oxynitride, and may have a single layer structure or a multi-layered structure including one or more inorganic insulating materials.

While FIG. 10 shows that the upper electrode CE2 of the storage capacitor Cst is arranged at (e.g., in or on) the same layer as that of the lower gate electrode G3A of the third gate electrode GE3, the present disclosure is not limited thereto. In another embodiment, the upper electrode CE2 of the storage capacitor Cst may be arranged at (e.g., in or on) the same layer as that of the third semiconductor layer A3, and may include the same material as that of the first region B3 and the second region D3 of the third semiconductor layer A3.

The first transistor T1 may be electrically connected to the third transistor T3 through the node connection line 166. The node connection line 166 may be disposed on the third interlayer insulating layer 210. One side (e.g., one end) of the node connection line 166 may be connected to the first gate electrode GE1 of the first transistor T1, and another side (e.g., another end) of the node connection line 166 may be connected to the first region B3 of the third semiconductor layer A3 of the third transistor T3.

The node connection line 166 may include aluminum (Al), copper (Cu), and/or titanium (Ti), and may have a single layer structure or a multi-layered structure including one or more of the above materials. As an example, the node connection line 166 may have a triple-layered structure of a titanium layer/an aluminum layer/a titanium layer.

A first organic insulating layer 211 may be disposed on the node connection line 166. The first organic insulating layer 211 may include an organic insulating material. The organic insulating material may include acryl, benzocyclobutene (BCB), polyimide, or hexamethyldisiloxane (HMDSO).

The data line DL and the driving voltage line PL may be disposed on the first organic insulating layer 211. The data line DL and the driving voltage line PL may include aluminum (Al), copper (Cu), and/or titanium (Ti), and may have a single layer structure or a multi-layered structure including one or more of the above materials. As an example, the data line DL and the driving voltage line PL may each have a triple-layered structure of a titanium layer/an aluminum layer/a titanium layer.

Although FIG. 10 shows that the data line DL and the driving voltage line PL are disposed at (e.g., in or on) the same layer as each other (e.g., on the first organic insulating layer 211), the data line DL and the driving voltage line PL may be disposed at (e.g., in or on) different layers from each other in another embodiment.

A second organic insulating layer 212, a third organic insulating layer 213, and a fourth organic insulating layer 214 may be disposed on the first organic insulating layer 211. The second organic insulating layer 212, the third organic insulating layer 213, and the fourth organic insulating layer 214 may each include an organic insulating material, such as acryl, benzocyclobutene, polyimide, or hexamethyldisiloxane (HMDSO).

A first electrode 221 of the first light-emitting diode ED1 may be disposed on the fourth organic insulating layer 214. The first electrode 221 may be electrically connected to the sixth transistor T6 through first to fourth connection metals CM1, CM2, CM3, and CM4. The first connection metal CM1 may be formed at (e.g., in or on) the same layer as that of the node connection line 166, and may include the same material as that of the node connection line 166. The second connection metal CM2 may be formed at (e.g., in or on) the same layer as that of the data line DL and/or the driving voltage line PL, and may include the same material as that of the data line DL and/or the driving voltage line PL. The third connection metal CM3 and the fourth connection metal CM4 may include the same material as that of the second conductive bus line and that of the first conductive bus line, respectively, described above with reference to FIGS. 8 and 9. The third connection metal CM3 and the fourth connection metal CM4 may each include a light transmissive conductive material.

The first electrode 221 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a suitable compound thereof. In another embodiment, the first electrode 221 may further include a conductive oxide material layer on and/or under the reflective layer. The conductive oxide material layer may include indium tin oxide (ITO), indium zinc oxide (IZO), zinc oxide (ZnO), indium oxide ($In_2O_3$), indium gallium oxide (IGO), indium zinc gallium oxide, and/or aluminum zinc oxide (AZO). In an embodiment, the first electrode 221 may include a plurality of layers. As an example, the first electrode 221 may include first to third sub-layers 221*a*, 221*b*, and 221*c*. The first to third sub-layers 221*a*, 221*b*, and 221*c* may be an ITO layer, an Ag layer, and an ITO layer, respectively.

A bank layer 215 may be disposed on the first electrode 221. The bank layer 215 may cover the edges of the first electrode 221, and may include an opening that overlaps with the first electrode 221. The bank layer 215 may include an organic insulating material, such as polyimide.

A spacer 217 may be formed on the bank layer 215. The spacer 217 may be formed together during the same process as a process of forming the bank layer 215, or may be formed separately during a separate process. In an embodiment, the spacer 217 may include an organic insulating material, such as polyimide. In another embodiment, the bank layer 215 may include an organic insulating material including a light-blocking dye, and the spacer 217 may include an organic insulating material, such as polyimide.

An intermediate layer 222 includes an emission layer 222*b*. The intermediate layer 222 may include a first functional layer 222*a* and/or a second functional layer 222*c*. The first functional layer 222*a* is under (e.g., underneath) the emission layer 222*b*, and the second functional layer 222*c* is over the emission layer 222*b*. The emission layer 222*b* may include a polymer organic material or a low-molecular weight organic material that emits light having a suitable color (e.g., a predefined or preset color), for example, such as red, green, or blue. In another embodiment, the emission layer 222*b* may include an inorganic material or quantum dots.

The second functional layer 222*c* may include an electron transport layer (ETL) and/or an electron injection layer (EIL). The first functional layer 222*a* and the second functional layer 222*c* may each include an organic material.

The emission layer 222*b* may be formed at (e.g., in or on) the first display area DA1 to overlap with the first electrode 221 through the opening of the bank layer 215. In comparison, an organic material layer, for example, such as the first functional layer 222*a* and/or the second functional layer 222*c* included in the intermediate layer 222, may cover the display area DA (e.g., see FIG. 3) entirely.

The intermediate layer 222 may have a single stack structure including a single emission layer, or a tandem structure, which is a multi-stacked structure including a plurality of emission layers. In the case where the intermediate layer 222 has the tandem structure, a charge generation layer CGL may be disposed between the plurality of stacked layers.

A second electrode 223 may be disposed on the intermediate layer 222, and may include a conductive material having a low work function. As an example, the second electrode 223 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), or a suitable alloy thereof. As another example, the second electrode 223 may further include a layer on the (semi) transparent layer, the layer including ITO, IZO, ZnO, or $In_2O_3$. The second electrode 223 may cover the display area DA (e.g., see FIG. 3) entirely.

A capping layer 225 may be disposed on the second electrode 223. The capping layer 225 may include an inorganic material or an organic material. The capping layer 225 may include lithium fluoride (LiF), an inorganic insulating material, and/or an organic insulating material. The capping layer 225 may cover the display area DA entirely.

The first light-emitting diode ED1 may be covered by the encapsulation layer 300. The encapsulation layer 300 may include at least one organic encapsulation layer, and at least one inorganic encapsulation layer. In an embodiment, FIG. 10 shows that the encapsulation layer 300 includes first and second inorganic encapsulation layers 310 and 330, and an organic encapsulation layer 320 therebetween. The encapsulation layer 300 may be disposed on the capping layer 225.

The first inorganic encapsulation layer 310 and the second inorganic encapsulation layer 330 may include at least one inorganic material from among aluminum oxide, titanium oxide, tantalum oxide, hafnium oxide, zinc oxide, silicon oxide, silicon nitride, or silicon oxynitride. The first and second inorganic encapsulation layers 310 and 330 may include a single layer structure or a multi-layered structure including one or more of the above materials. The organic encapsulation layer 320 may include a polymer-based material. The polymer-based material may include an acryl-based resin, an epoxy-based resin, polyimide, and/or polyethylene. In an embodiment, the organic encapsulation layer 320 may include acrylate.

Figure 11:
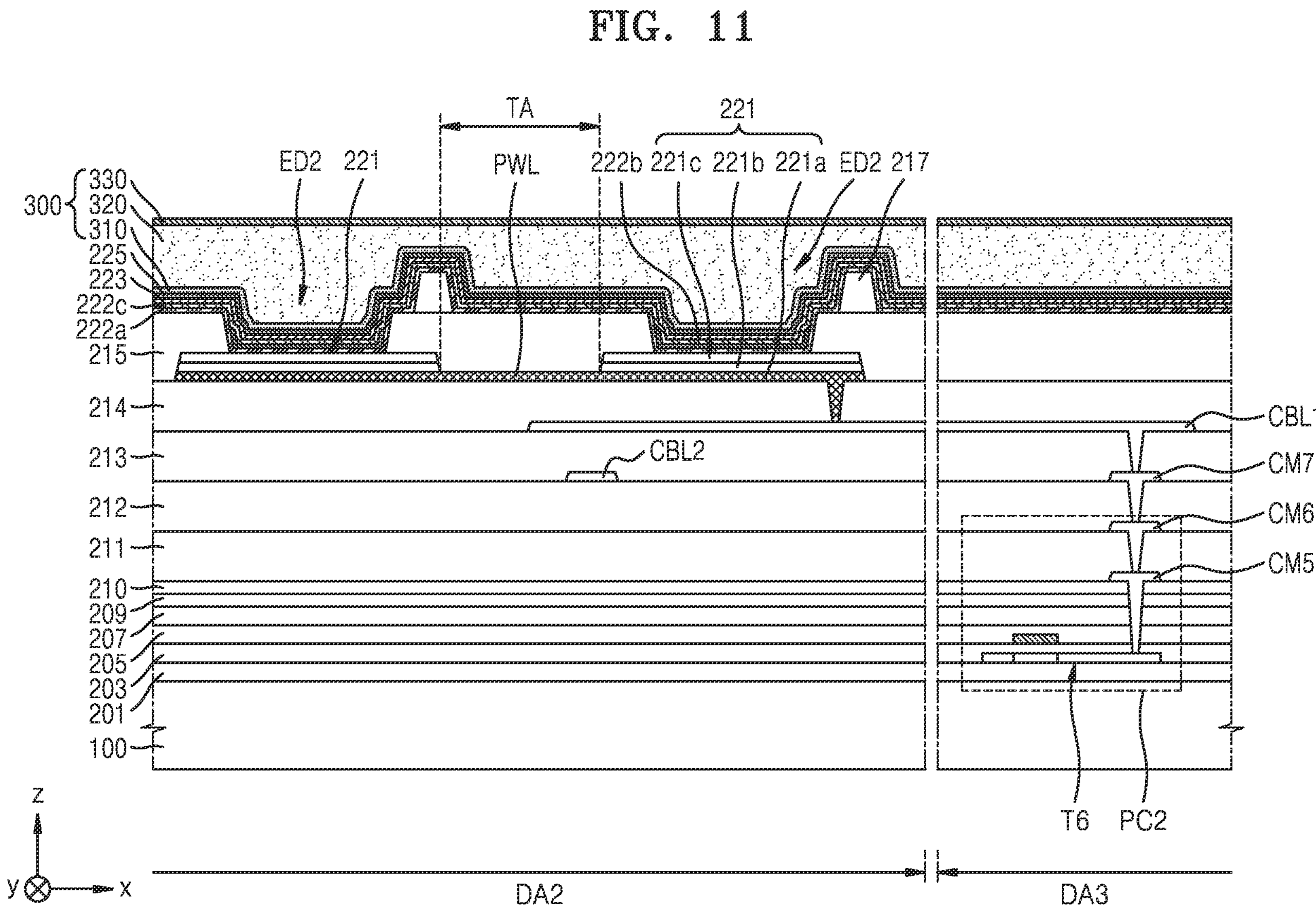
FIG. 11 is a cross-sectional view showing an electrical connection of a second light-emitting diode and a second sub-pixel circuit of a display panel according to an embodiment.

FIG. 11 is a cross-sectional view showing an electrical connection of a second light-emitting diode and a second sub-pixel circuit of the display panel 10 according to an embodiment. The second sub-pixel circuit PC2 shown in FIG. 11 may correspond to one of the second sub-pixel circuits arranged in the first row, as described above with reference to FIG. 7.

Referring to FIG. 11, the second sub-pixel circuit PC2 may be arranged on the substrate 100 at (e.g., in or on) the third display area DA3, and the second light-emitting diode ED2 that is electrically connected to the second sub-pixel circuit PC2 may be arranged at (e.g., in or on) the second display area DA2. As described above with reference to FIG. 4, the second sub-pixel circuit PC2 may include the plurality of transistors and the storage capacitor. For example, FIG. 11 shows the sixth transistor T6 of the second sub-pixel circuit PC2. The buffer layer 201, the first gate insulating layer 203, the first interlayer insulating layer 205, the second interlayer insulating layer 207, the second gate insulating layer 209, the third interlayer insulating layer 210, and the first to fourth organic insulating layers 211, 212, 213, and 214 may be disposed on the substrate 100.

The second sub-pixel circuit PC2 may be electrically connected to the second light-emitting diode ED2 through the first conductive bus line CBL1 extending from the third display area DA3 to the second display area DA2. As an example, the first conductive bus line CBL1 may extend in the first direction (e.g., the x direction), and a portion of the first conductive bus line CBL1 may overlap with a portion of the second conductive bus line CBL2 extending in the second direction (e.g., the y direction). The first and second conductive bus lines CBL1 and CBL2 may each include a light transmissive conductive material as described above. Because the first and second conductive bus lines CBL1 and CBL2 include the light transmissive conductive material, even though a portion of the first and second conductive bus lines CBL1 and CBL2 may be located at (e.g., in or on) the transmissive area TA, a transmittance of the transmissive area TA may be sufficiently secured.

The first conductive bus line CBL1 may be electrically connected to the sixth transistor T6 of the second sub-pixel circuit PC2 through fifth to seventh connection metals CMS, CM6, and CM7. The fifth connection metal CM5 may be formed at (e.g., in or on) the same layer as that of the first connection metal CM1 (e.g., see FIG. 10), and may include the same material as that of the first connection metal CM1.

The sixth connection metal CM6 may be formed at (e.g., in or on) the same layer as that of the second connection metal CM2 (e.g., see FIG. 10), and may include the same material as that of the second connection metal CM2. The seventh connection metal CM7 may be formed at (e.g., in or on) the same layer as that of the third connection metal CM3 (e.g., see FIG. 10), and may include the same material as that of the third connection metal CM3.

The first conductive bus line CBL1 may be electrically connected to the first electrode 221 of one of the second light-emitting diodes ED2 located at (e.g., in or on) the second display area DA2. As an example, the first electrode 221 of one of the second light-emitting diodes ED2 may be electrically connected to the first conductive bus line CBL1 through a contact hole of (e.g., penetrating) the fourth organic insulating layer 214. In an embodiment, as described above with reference to FIG. 10, the first electrode 221 may include the first sub-layer 221*a* including ITO, the second sub-layer 221*b* including Ag, and the third sub-layer 221*c* including ITO.

The bank layer 215 and a spacer 217 may be disposed on the first electrode 221 of the second light-emitting diode ED2. The bank layer 215 includes an opening that overlaps with the first electrode 221. In addition, as described above with reference to FIG. 10, the first functional layer 222*a*, the emission layer 222*b*, the second functional layer 222*c*, the second electrode 223, the capping layer 225, and the encapsulation layer 300 may be disposed on the first electrode 221.

One of the second light-emitting diodes ED2 that is electrically connected to the second sub-pixel circuit PC2 through the first conductive bus line CBL1 may be electrically connected to another second light-emitting diode ED2 that emits light of the same color through the connection line PWL. The connection line PWL of FIG. 11 corresponds to one of the first to third connection lines PWL1, PWL2, and PWL3 described above with reference to FIGS. 8 and 9.

The connection line PWL may be disposed at (e.g., in or on) the same layer as that of the first electrodes 221 of the two light-emitting diodes ED2 that are connected to each other by the connection line PWL (e.g., on the fourth organic insulating layer 214). The connection line PWL may be connected to one of the sub-layers, as one body, included in each of the two first electrodes 221 connected to each other by the connection line PWL. As an example, the connection line PWL may be formed as one body (e.g., may be integrally formed) with the first sub-layer 221*a* disposed in the lowermost portion of the sub-layers of the first electrode 221. The connection line PWL may be formed during a process of forming the first electrode 221. In an embodiment, the first sub-layer 221*a* and the connection line PWL may include the same material as each other, for example, such as crystallized ITO.

The capping layer 225 and the encapsulation layer 300 are disposed on the second electrode 223 of the second light-emitting diodes ED2, as described above with reference to FIG. 10.

Although FIG. 11 shows that the first conductive bus line CBL1 is disposed on the third organic insulating layer 213, and the second conductive bus line CBL2 is disposed on the second organic insulating layer 212, the present disclosure is not limited thereto. In another embodiment, the first conductive bus line CBL1 may be disposed on the second organic insulating layer 212, and the second conductive bus line CBL2 is disposed on the third organic insulating layer 213.

Although FIG. 11 shows that the connection line PWL is disposed at (e.g., in or on) the same layer as that of the first electrode 221 (e.g., on the fourth organic insulating layer 214), the present disclosure is not limited thereto. In another embodiment, the connection line PWL may be disposed between the substrate 100 and the first electrode 221, which is described in more detail with reference to FIG. 12.

Figure 12:
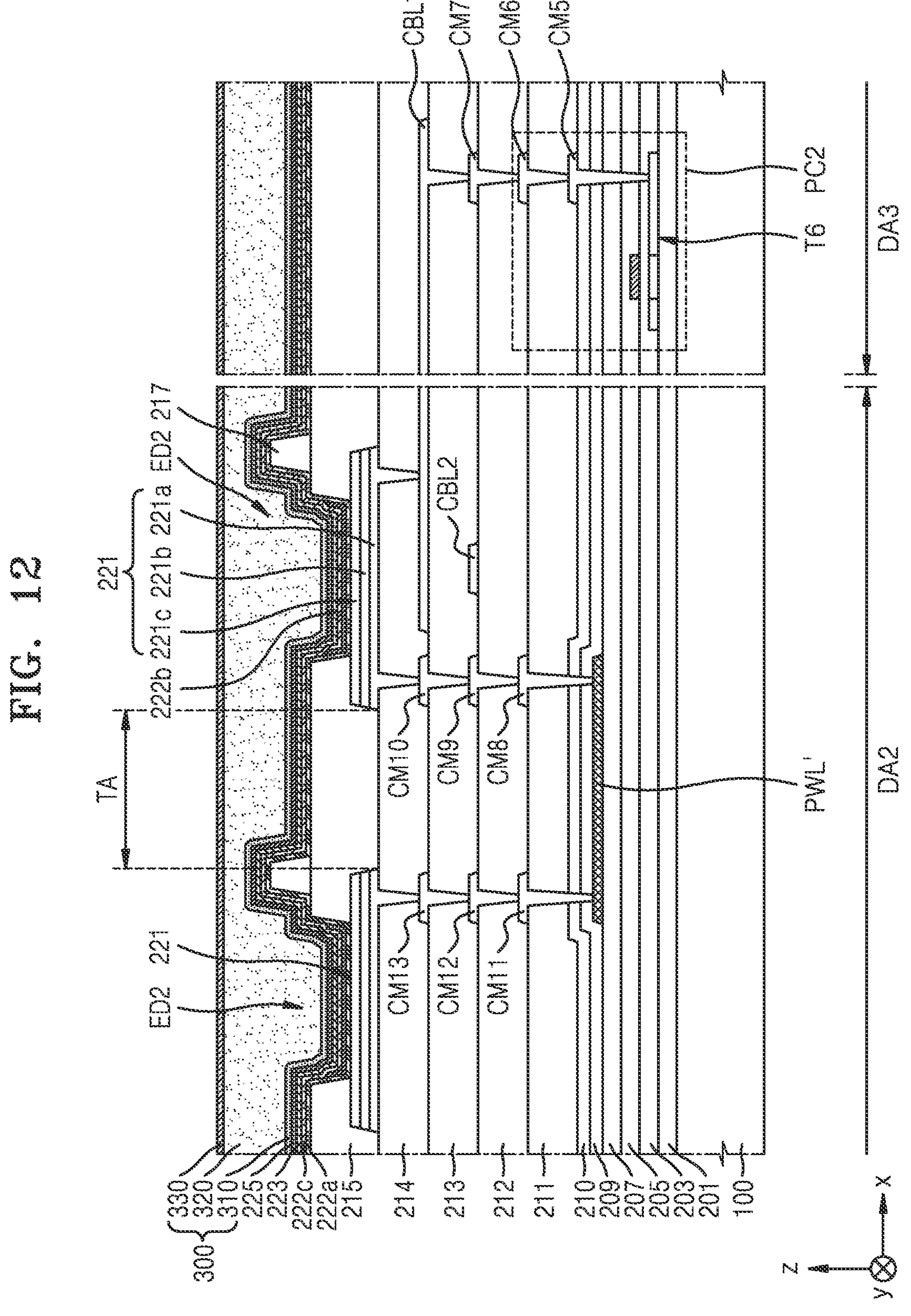
FIG. 12 is a cross-sectional view showing an electrical connection of a second light-emitting diode and a second sub-pixel circuit of a display panel according to another embodiment.

FIG. 12 is a cross-sectional view showing an electrical connection of a second light-emitting diode and a second sub-pixel circuit of the display panel 10 according to another embodiment. The embodiment shown in FIG. 12 may be the same or substantially the same as the embodiment shown in FIG. 11, except for the position of a connection line PWL', and thus, the differences therebetween may be mainly described hereinafter. In FIG. 12, the same reference numerals are used to denote the same or substantially the same elements as those described above with reference to FIG. 11, and thus, redundant description thereof may not be repeated.

Referring to FIG. 12, the connection line PWL' may be disposed between the substrate 100 and the first electrode 221 of the second light-emitting diode ED2. As an example, the connection line PWL' may be disposed at (e.g., in or on) the same layer as that of the third semiconductor layer of the third thin-film transistor described above with reference to FIG. 10 (e.g., on the second interlayer insulating layer 207). The connection line PWL' may include the same material as that of the third semiconductor layer. In more detail, the connection line PWL' may be made conductive as the first region and the second region of the third semiconductor layer described above with reference to FIG. 10. Because the connection line PWL' including an oxide-based semiconductor material has a light transmissive characteristic, even though the connection line PWL' is located at (e.g., in or on) the transmissive area TA, a transmittance of the transmissive area TA may be sufficiently secured.

One end of the connection line PWL' may be electrically connected to the first electrode 221 of one of the second light-emitting diodes ED2 through eighth to tenth connection metals CM8, CM9, and CM10. Another end of the connection line PWL' may be electrically connected to the first electrode 221 of another of the second light-emitting diodes ED2 through eleventh to thirteenth connection metals CM11, CM12, and CM13.

A structure of a connection line of the third light-emitting diodes arranged at (e.g., in or on) the third display area DA3 described above with reference to FIG. 8 may be the same or substantially the same as the structures of the connection lines PWL and PWL' described above with reference to FIGS. 11 and 12, and thus, redundant description thereof may not be repeated. As an example, a first connection line connecting two third red light-emitting diodes included in each light-emitting diode group described above with reference to FIG. 8, a second connection line connecting four third green light-emitting diodes, and a third connection line connecting three third blue light-emitting diodes, may have the same or substantially the same structure as any of the structures of the connection lines PWL and PWL' described above with reference to FIGS. 11 and 12.

According to one or more embodiments of the present disclosure, a transmittance of the second display area including the transmissive area may be sufficiently secured. Further, a display panel having excellent quality, such as preventing or substantially preventing a deviation in image quality between the first to third display areas, and an electronic apparatus including the display panel, may be provided. However, the above aspects and features are provided as examples, and the present disclosure is not limited to the above aspects and features.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display panel comprising:

a first display area, a second display area located within the first display area, and a third display area between the first display area and the second display area;

a plurality of light-emitting diodes comprising:

first light-emitting diodes located at the first display area;

second light-emitting diodes located at the second display area; and third light-emitting diodes located at the third display area;

a plurality of first sub-pixel circuits located at the first display area, and electrically connected to the first light-emitting diodes, respectively;

a plurality of second sub-pixel circuits and a plurality of third sub-pixel circuits located at the third display area, the plurality of second sub-pixel circuits being electrically connected to the second light-emitting diodes, and the plurality of third sub-pixel circuits being electrically connected to the third light-emitting diodes;

a first conductive bus line extending in a first direction, and electrically connecting one of the second light-emitting diodes to one of the plurality of second sub-pixel circuits; and a second conductive bus line extending in a second direction crossing the first direction, and electrically connecting another one of the second light-emitting diodes to another one of the plurality of second sub-pixel circuits, wherein the one of the second light-emitting diodes and the another one of the second light-emitting diodes are located in a same column as each other in the second direction, and wherein the second display area comprises a transmissive area between the second light-emitting diodes.

2. The display panel of claim 1, wherein the first conductive bus line and the second conductive bus line each extends from the third display area toward the second display area, and includes a light-transmissive conductive material.

3. The display panel of claim 2, further comprising an insulating layer between the first conductive bus line and the second conductive bus line, and wherein a portion of the first conductive bus line and a portion of the second conductive bus line cross each other with the insulating layer therebetween.

4. The display panel of claim 1, wherein the one of the plurality of second sub-pixel circuits is electrically connected to two of the second light-emitting diodes that are configured to emit light of a same color as each other.

5. The display panel of claim 4, wherein the two of the second light-emitting diodes that are configured to emit the light of the same color as each other are electrically connected to each other by a connection line including a light-transmissive conductive material.

6. A display panel comprising:

a first display area, a second display area located within the first display area, and a third display area between the first display area and the second display area;

a plurality of light-emitting diodes comprising:

first light-emitting diodes located at the first display area;

second light-emitting diodes located at the second display area; and third light-emitting diodes located at the third display area;

a plurality of first sub-pixel circuits located at the first display area, and electrically connected to the first light-emitting diodes, respectively;

a plurality of second sub-pixel circuits and a plurality of third sub-pixel circuits located at the third display area, the plurality of second sub-pixel circuits being electrically connected to the second light-emitting diodes, and the plurality of third sub-pixel circuits being electrically connected to the third light-emitting diodes;

a first conductive bus line extending in a first direction, and electrically connecting one of the second light-emitting diodes to one of the plurality of second sub-pixel circuits; and a second conductive bus line extending in a second direction crossing the first direction, and electrically connecting another one of the second light-emitting diodes to another one of the plurality of second sub-pixel circuits, wherein the one of the plurality of second sub-pixel circuits is spaced from the second display area in the first direction, the another one of the plurality of second sub-pixel circuits is spaced from the second display area in the second direction, and the one of the plurality of second sub-pixel circuits and the another one of the plurality of second sub-pixel circuits are electrically connected to a same data line as each other.

7. The display panel of claim 6, wherein the same data line is curved to partially surround the second display area.

8. The display panel of claim 6, wherein the one of the plurality of second sub-pixel circuits is electrically connected to a scan line that is electrically connected to the first sub-pixel circuits in a k-th row, where k is a natural number, and the another one of the plurality of second sub-pixel circuits is electrically connected to a scan line that is electrically connected to the first sub-pixel circuits in a (k+2n)-th row, where n is a natural number.

9. An electronic apparatus comprising:

a display panel including a first display area, a second display area located within the first display area, and a third display area between the first display area and the second display area; and a component overlapping with a transmissive area of the second display area, wherein the display panel comprises:

first light-emitting diodes located at the first display area;

a plurality of first sub-pixel circuits located at the first display area, and electrically connected to the first light-emitting diodes, respectively;

second light-emitting diodes located at the second display area;

third light-emitting diodes located at the third display area;

a plurality of second sub-pixel circuits and a plurality of third sub-pixel circuits located at the third display area, the plurality of second sub-pixel circuits being electrically connected to the second light-emitting diodes, and the plurality of third sub-pixel circuits being electrically connected to the third light-emitting diodes;

a first conductive bus line extending in a first direction, and electrically connecting one of the second light-emitting diodes to one of the plurality of second sub-pixel circuits;

a second conductive bus line extending in a second direction crossing the first direction, and electrically connecting another one of the second light-emitting diodes to another one of the plurality of second sub-pixel circuits; and an insulating layer between the first conductive bus line and the second conductive bus line, and wherein a portion of the first conductive bus line crosses a portion of the second conductive bus line, with the insulating layer therebetween.

10. The electronic apparatus of claim 9, wherein the component comprises a sensor or a camera.

11. The electronic apparatus of claim 9, wherein the first conductive bus line and the second conductive bus line each includes a light-transmissive conductive material.

12. The electronic apparatus of claim 9, wherein the one of the second light-emitting diodes and the another one of the second light-emitting diodes are located in a same column as each other in the second direction.

13. The electronic apparatus of claim 9, wherein the one of the plurality of second sub-pixel circuits is spaced from the second display area in the first direction, the another one of the plurality of second sub-pixel circuits is spaced from the second display area in the second direction, and the one of the plurality of second sub-pixel circuits and the another one of the plurality of second sub-pixel circuits are electrically connected to a same data line as each other.

14. The electronic apparatus of claim 13, wherein the same data line is curved to partially surround the second display area.

15. The electronic apparatus of claim 13, wherein the one of the plurality of second sub-pixel circuits is electrically connected to a scan line that is electrically connected to the first sub-pixel circuits in a k-th row, where k is a natural number, and the another one of the plurality of second sub-pixel circuits is electrically connected to a scan line that is electrically connected to the first sub-pixel circuits in a (k+2n)-th row, where n is a natural number.

16. The electronic apparatus of claim 9, wherein the one of the plurality of second sub-pixel circuits is electrically connected to two of the second light-emitting diodes configured to emit light of a same color as each other.

17. The electronic apparatus of claim 16, wherein the two of the second light-emitting diodes configured to emit the light of the same color as each other are electrically connected to each other by a connection line including a light-transmissive conductive material.

* * * * *